(12) United States Patent
Okuda et al.

(10) Patent No.: US 8,435,646 B2
(45) Date of Patent: May 7, 2013

(54) ORGANIC ELECTROLUMINESCENT DEVICE AND DISPLAY DEVICE

(75) Inventors: Daisuke Okuda, Kanagawa (JP);
Katsuhiro Sato, Kanagawa (JP);
Kiyokazu Mashimo, Kanagawa (JP);
Takeshi Agata, Kanagawa (JP); Toru Ishii, Kanagawa (JP); Akira Imai, Kanagawa (JP); Tadayoshi Ozaki, Kanagawa (JP); Hidekazu Hirose, Kanagawa (JP); Hirohito Yoneyama, Kanagawa (JP); Mieko Seki, Kanagawa (JP); Yohei Nishino, Kanagawa (JP);
Koji Horiba, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 918 days.

(21) Appl. No.: 11/977,264

(22) Filed: Oct. 24, 2007

(65) Prior Publication Data
US 2009/0001876 A1    Jan. 1, 2009

(30) Foreign Application Priority Data

Jan. 26, 2007   (JP) ................. 2007-017167

(51) Int. Cl.
*H01L 51/54* (2006.01)
(52) U.S. Cl.
USPC .......... 428/690; 428/917; 313/504; 313/505; 313/506; 257/40; 257/E51.05; 257/E51.026; 257/E51.032
(58) Field of Classification Search .......... 428/690, 428/917; 313/504, 505, 506; 257/40, E51.05, 257/E51.026, E51.032; 564/26, 426, 434
See application file for complete search history.

(56) References Cited

U.S. PATENT DOCUMENTS 5,294,870 A * 3/1994 Tang et al. .......... 313/504
2003/0129451 A1* 7/2003 Nukada et al. .......... 428/690

FOREIGN PATENT DOCUMENTS

JP        2005-235646       * 9/2005

OTHER PUBLICATIONS

Cui et. al, Anode Interfacial . . . in Organic Light Emitting Diodes, 2002, Langmuir, vol. 18, pp. 9958-9970.*

(Continued)

*Primary Examiner* — Jennifer Chriss
*Assistant Examiner* — Gregory Clark
(74) *Attorney, Agent, or Firm* — Fildes & Outland, P.C.

(57) ABSTRACT

An organic electroluminescent device, having an organic compound layer including two or more layers including at least a buffer layer and an emitting layer, wherein at least one of the organic compound layers other than the buffer layer contains at least one charge-transporting polyester represented by Formula (I-1) or (I-2), and the buffer layer is formed in contact with an anode and contains a crosslinked compound formed by using at least one charge injection material containing a substituted silicon group and represented by Formula (III).

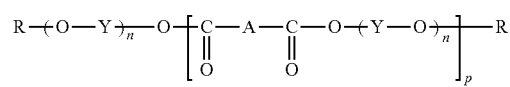

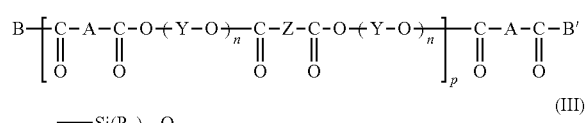

17 Claims, 1 Drawing Sheet

OTHER PUBLICATIONS

English Translation of JP 2005-235646.*
Thin Solid Films, 94, 1982, pp. 171-183.
Appl. Phys. Lett. vol. 51, Sep. 21, 1987 pp. 913-915.
Proceedings of the 40$^{th}$ Applied Physics Related Associated Seminar, 30a-SZK-14, 1993.
Polymer Preprints, Japan, vol. 42, No. 7, 20J-21, 1993.
Nature, vol. 357, Jun. 11, 1992, pp. 477-479.
Proceedings of the 38$^{th}$ Applied Physics Related Associated Seminar, 31p-G-12, 1991.
Proceedings of the 50$^{th}$ Applied Physics Society Seminar, 29p-ZP-5, 1989.
Proceedings of the 51$^{th}$ Applied Physics Society Seminar, 28a-PB-7, 1990.

* cited by examiner

ORGANIC ELECTROLUMINESCENT DEVICE AND DISPLAY DEVICE

CROSS REFERENCE TO RELATED APPLICATIONS

This application is based on and claims priority under 35 USC 119 from Japanese Patent Application No. 2007-17167 filed on Jan. 26, 2007.

BACKGROUND

1. Technical Field

The present invention relates to an organic electroluminescent device and a display device.

2. Related Art

Electroluminescent devices, selfluminous all-solid-state devices that are more visible and resistant to shock, are expected to find wider application.

Researches on electroluminescent devices by using organic compounds started with a single crystal for example of anthracene, but single crystals, which were larger in thickness at a film thickness of approximately 1 mm, demanded a high driving voltage of 100 V or more.

Recently, research and development on such laminated EL devices have been in progress intensively.

Such a laminated-film device gives high-brightness emission, while positive holes and electrons are injected from electrodes through a charge-transporting layer of a charge-transporting organic compound into an emitting layer of a fluorescent organic compound and the positive holes and electrons injected and trapped into the light-emitting layer recombined to each other while the carrier balance between the positive hole and the electron is maintained.

Display devices using an organic electroluminescent device are more suited for reduction in size and thickness than other display devices such as liquid crystal, and would be used more widely in portable devices driven by an internal power supply. It is important to make the device operate for a longer period with lower power consumption for use in such a portable device.

On the other hand, organic electroluminescent devices commonly have a basic layer structure composed of an ITO transparent electrode (anode), a positive hole-transporting layer (or light-emitting layer having a charge-transporting potential) provided thereon, and other layers provided as needed. For use in the applications described above and for energy conservation, known is a method of providing a buffer layer between the transparent electrode and the positive hole-transporting layer (or light-emitting layer having a charge-transporting potential) and thus, improving the charge (positive hole) injection efficiency into the positive hole-transporting layer (or light-emitting layer having a charge-transporting potential), and it is possible to reduce the driving voltage by the method. Examples of the materials for the buffer layer include PEDOT (polyethylene-dioxythiophene), star-burst amines, CuPc (copper phthalocyanine), and the like.

SUMMARY

According to an aspect of the present invention, there is provided an organic electroluminescent device comprising an anode and a cathode, at least one of which is transparent or translucent, and an organic compound layer disposed between the anode and the cathode, the organic compound layer having two or more layers including at least a buffer layer and an emitting layer; at least one of the organic compound layers other than the buffer layer containing at least one charge-transporting polyester represented by the following Formula (I-1) or (I-2); and the buffer layer being provided in contact with the anode and containing a crosslinked compound formed by using at least one charge injection material containing a substituted silicon group represented by the following Formula (III):

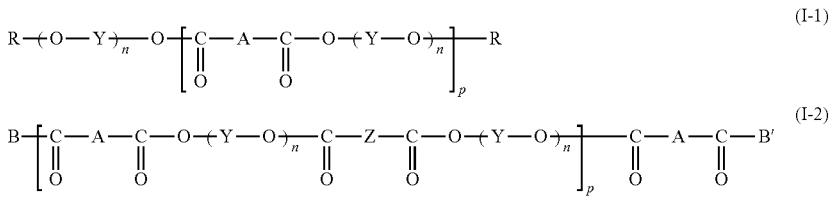

in Formulae (I-1) and (I-2), A representing at least one structure selected from the structures represented by the following Formulae (II-1) and (II-2); R representing a hydrogen atom, an alkyl group, a substituted or unsubstituted aryl group, or a substituted or unsubstituted aralkyl group; Y representing a dihydric alcohol residue; Z representing a divalent carboxylic acid residue; B and B' each independently representing a group —O—(Y—O)$_n$—R or a group —O—(Y—O)$_n$—CO—Z—CO—O—R', when, R, Y, and Z are the same as those described above; R' represents an alkyl group, a substituted or unsubstituted aryl group, or a substituted or unsubstituted aralkyl group; and n is an integer of 1 to 5; n being an integer of 1 to 5; and p being an integer of 5 to 5,000,

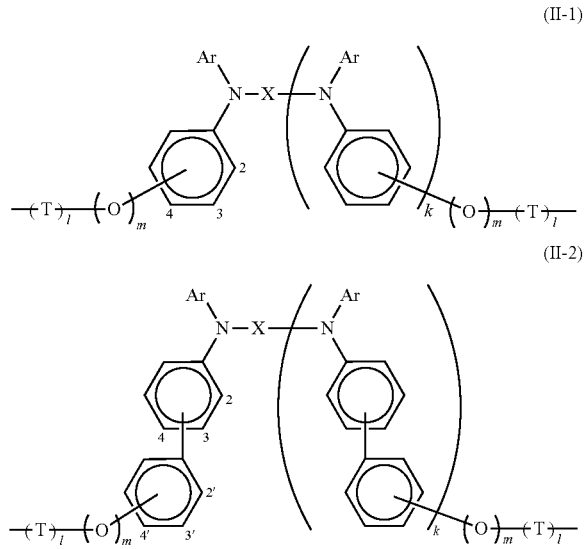

in Formulae (II-1) and (II-2), Ar representing a substituted or unsubstituted monovalent aromatic group; X representing a substituted or unsubstituted divalent aromatic group; k, m, and l each being 0 or 1; and T representing a divalent straight-chain hydrocarbon having 1 to 6 carbon atoms or a branched hydrocarbon having 2 to 10 carbon atoms, and

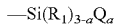   (III)

in Formula (III), $R_1$ representing a hydrogen atom, an alkyl group, or a substituted or unsubstituted aryl group; Q representing a hydrolytic group; and a being an integer of 1 to 3.

BRIEF DESCRIPTION OF THE DRAWINGS

Exemplary embodiments of the invention will be described in detail on the following figures, wherein.

DETAILED DESCRIPTION

Figure 1:
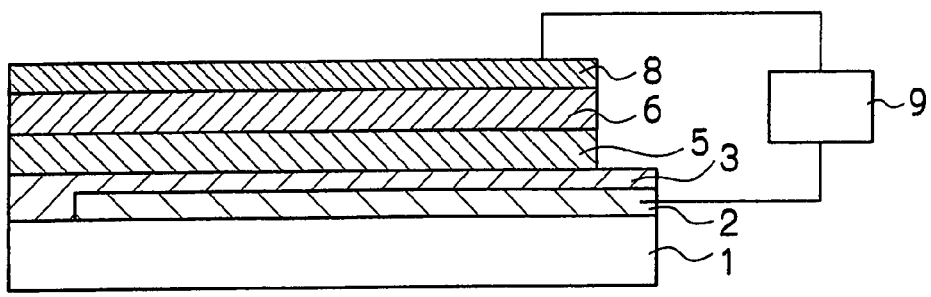
FIG. 1 is a schematic sectional view illustrating an example of layer structure of organic electroluminescent device of an exemplary embodiment.

Hereinafter, exemplary embodiments of the invention will be described in detail.

The organic electroluminescent device in the exemplary embodiment has an anode and a cathode, at least one of which is transparent or translucent, and an organic compound layer disposed between the anode and the cathode, the organic compound layer having two or more layers including at least a buffer layer and an emitting layer; at least one of the organic compound layers other than the buffer layer containing at least one charge-transporting polyester represented by the following Formula (I-1) or (I-2); and the buffer layer being provided in contact with the anode and containing a crosslinked compound formed by using at least one charge injection material containing a substituted silicon group represented by the following Formula (III):

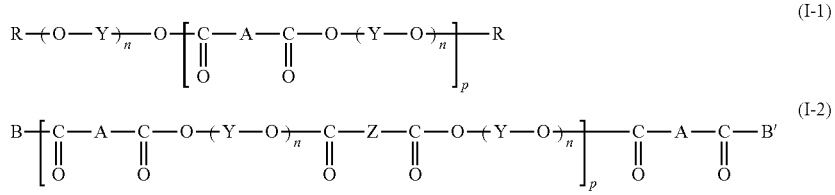

in Formulae (I-1) and (I-2), A representing at least one structure selected from the structures represented by the following Formulae (II-1) and (II-2); R representing a hydrogen atom, an alkyl group, a substituted or unsubstituted aryl group, or a substituted or unsubstituted aralkyl group; Y representing a dihydric alcohol residue; Z representing a divalent carboxylic acid residue; B and B' each independently representing a group —O—(Y—O)$_n$—R or a group —O—(Y—O)$_n$—CO—Z—CO—O—R', when, R, Y, and Z are the same as those described above; R' represents an alkyl group, a substituted or unsubstituted aryl group, or a substituted or unsubstituted aralkyl group; and n is an integer of 1 to 5; n being an integer of 1 to 5; and p being an integer of 5 to 5,000,

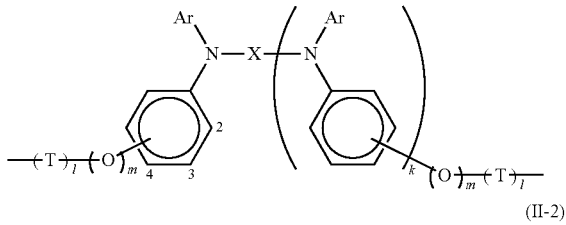

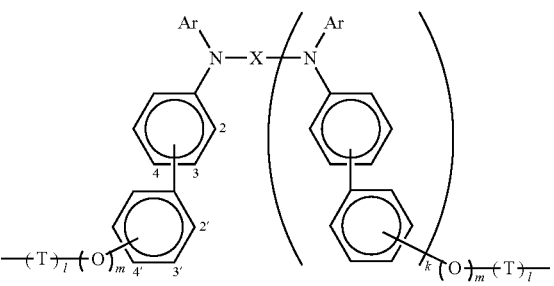

in Formulae (II-1) and (II-2), Ar representing a substituted or unsubstituted monovalent aromatic group; X representing a substituted or unsubstituted divalent aromatic group; k, m, and l each being 0 or 1; and T representing a divalent straight-chain hydrocarbon having 1 to 6 carbon atoms or a branched hydrocarbon having 2 to 10 carbon atoms, and

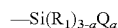   (III)

in Formula (III), $R_1$ representing a hydrogen atom, an alkyl group, or a substituted or unsubstituted aryl group; Q representing a hydrolytic group; and a being an integer of 1 to 3.

The organic electroluminescent device in the configuration of the exemplary embodiment is superior in brightness, stability and durability and easier to produce, allows expansion of the device area, gives a smaller number of defects during production, and shows smaller deterioration in device performance with time. It is based on the results of the studies described below.

The inventors have studied intensively the reasons for various defects during production for an organic electroluminescent device provided with the buffer layer and also for deterioration in device performance with time. They have also studied the problems in forming a positive hole-transporting layer or an emitting layer having a charge-transporting potential on the surface of a buffer layer formed on an anode (hereinafter, a layer formed directly or indirectly via another layer on the buffer layer will be referred to as "neighboring layer") by using a polymeric charge-transporting material.

As a result, it was confirmed that, when the charge-transporting polymer used was a polymer having a vinyl skeleton (see, e.g., PTPDMA (Jap. J. Polymer Sci. Tech., Vol. 52, 216 (1995)) or a polymer having a polycarbonate skeleton (see, e.g., Et-TPAPEK (Preprint of 43rd Conference of Applied Physics-related Societies, 27a-SY-19, pp. 1, 126 (1996)), the buffer layer was less adhesive to the neighboring layer, causing defect of exfoliation and generation of pinholes and aggregation. The reasons for the defects seemed incompatibility between the buffer layer and the neighboring layer at the interface and lacking of flexibility of the polymer constituting the neighboring layer.

Therefore, the inventors have considered that, for prevention of defects during film formation, it would be effective to make the charge-transporting polymer for use in forming the neighboring layer more molecularly flexible or to allow reorganization among molecules in the neighboring layer by using a material having a high-flexibility molecular structure, or by reducing the size of molecule (reduction in molecular weight) even if a material having a low-flexibility molecular structure described above is used.

The reasons for deterioration in device performance with time were also studied. As a result, it was found that, if the charge-transporting polymer used has a vinyl- or polycarbonate-based skeleton similarly to those described above, it caused increase in driving voltage and power consumption with time and further deterioration in the emitting characteristics.

Further studies on the reasons revealed that a low-molecular weight component contained in the buffer layer (e.g., star-burst amine or CuPc (copper phthalocyanine) or the counter ion of an ionic substance used in combination with PEDOT (polyethylene-dioxythiophene)) bled (exudated) into the neighboring layer with the passage of time by the Joule's heat generated when electric field is applied to the device, prohibiting the function inherent to the neighboring layer. The bleeding indicates that the low-molecular weight component in the buffer layer readily permeates into the neighboring layer formed by using a charge-transporting polymer having a vinyl- or polycarbonate-skeleton, in other words that there is a greater/easily-formed gap between the charge-transporting polymers in the neighboring layer.

Accordingly, the inventors have considered it important to form a dense, highly heat-resistant neighboring layer for prevention of bleeding of the low-molecular weight component into the neighboring layer. In such a case, it is important for prevention of bleeding to reduce the gap between molecules facilitating bleeding of low-molecular weight components during formation of the neighboring layer and to prevent relative migration of molecules in the neighboring layer once formed and generation of the intermolecular gap under heat.

Accordingly, it is needed for prevention of bleeding to use a material having a molecular structure superior in heat resistance (glass transition temperature), flexibility and closeness as the charge-transporting polymer for forming the neighboring layer. However, the condition has an antinomic relationship with the use of a charge-transporting polymer having a molecular structure lower in flexibility, an option in preventing generation of the defects during film formation.

Alternatively for drastic prevention of bleeding, it would be effective to use a material containing no low-molecular weight component causing bleeding as the charge injection material or an additive thereto used in forming the buffer layer.

In addition, the charge-transporting polymer should have a certain number of hopping sites for charge transfer in the molecule, for assurance of high charge mobility, which is critical for favorable emitting characteristics of the organic electroluminescent device. In other words, the polymer should have a molecule size (molecular weight) of a particular value or more. However, the condition is also antinomic with the use of a low-molecular-weight charge-transporting polymer having a structure lower in flexibility, an option in preventing generation of defects during film formation, similarly to the case of bleed control.

It is essentially difficult to form a dense neighboring layer for prevention of bleeding with a charge-transporting polymer having a less flexible molecular structure, and thus, such a polymer has a dilemma that is difficult to overcome that reduction in the molecular weight for prevention of bleeding leads to deterioration in heat resistance, and consequently to acceleration of bleeding and deterioration in charge mobility which affects the entire basic characteristics of the device.

For assuring the basic emitting characteristics and from the points of processability and practical utility during long-term use, the inventors considered that, in preparing an organic electroluminescent device provided with a buffer layer, it was important to use a material in the molecular structure sufficiently higher in charge mobility, higher in flexibility and closeness, and higher in heat resistance as the charge-transporting polymer for forming the neighboring layer when a bleed-causing material is used for the buffer layer.

The charge-transporting polyester has the following characteristics:
(1) The ester bond connecting functional sites to each other is a strong bond and resistant to deformation.
(2) The polyester has its polar group in the main chain, and thus, the influence thereof on charge transport is smaller than that having the polar group on the side chain. Further, addition of a spacer is effective in reducing the influence of the polar group.
(3) The polyester is superior in adhesiveness to the neighboring layer (in particular, buffer layer) with its polar ester bond group.

For that reasons above, it is desirable to use polyester having its functional units incorporated in the main chain as the charge-transporting polymer.

For drastic prevention of bleeding, it would be needed to form the buffer layer with a component essentially demanding no bleed-causing low-molecular weight component, and thus, for example, the charge injection material is preferably formed not in the state containing low-molecular weight compounds, but formed with a material forming strong bonds in a network structure.

The material forming a network structure (network) is, for example, a three-dimensionally crosslinking material, and specific examples thereof for the charge injection material include:
(A) charge-transporting polyesters having a particular repetition structure and a hydroxyl or carboxyl group at the terminal and polycarbonates crosslinked with a crosslinking agent having three or more functional isocyanate or epoxy groups in the molecule (see, JP-A Nos. 8-176293, 8-208820, 8-253568, and 9-110974, and others);
(B) crosslinked charge-transporting materials having a heat- or photo-curable functional group at the terminal (see JP-A Nos. 2000-147804 and 2000-147813, and others);
(C) photo-crosslinked oxetane-containing charge transporting materials (see Macromol. Rapid Commun., 20, pp. 224-228 (1999)); and
(D) heat-crosslinked charge transporting materials having a alkoxysilyl group at the terminal (see Adv. Mater., Vol. 11, No. 2, pp. 107-112 (1999), Adv. Mater., Vol. 11, No. 9, pp. 730-734 (1999), JP-A Nos. 9-124665 and 11-38656, and others), and the like.

The buffer layer formed by three-dimensional crosslinking of the charge injection material containing substituted silicon group causes a crosslinking reaction with the substituted silicon group represented by Formula (III) described below, forming three dimensional —Si—O—Si— bonds, i.e., an effective inorganic glassy network structure (network), and such a product is superior in adhesiveness to a mainly inorganic substrate. Thus, the three-dimensional crosslinking is favorable, because it gives strong bonds and increases the adhesiveness to an anode mainly made of an inorganic material, and improves the properties of the organic electroluminescent device. In addition, use of the charge injection material represented by Formula (IV-1) to (IV-4) described below introduces an aromatic amine structural unit in the three-dimensional crosslinked structure, giving favorable injection efficiency in the neutral state without need for improvement in conductivity by using the doping effect by combined use of an electron-accepting material, and thus, allowing prevention of the bleeding to the neighboring organic compound layer, differently from the case when an electron-accepting material is blended as an additive.

Thus, it is possible to produce an organic EL device that is resistant to bleeding of the charge injection material into neighboring layer and superior in adhesiveness to the anode by use of the buffer layer above, that has a charge mobility sufficient for organic EL device because of a neighboring organic layer formed with the charge-transporting polyester, and thus, that is lowered in the number of defects such as pinhole and aggregation, superior in adhesiveness to the buffer layer, and thus, higher in performance for use in a longer period of time.

It is possible to form the organic compound layer in wet process, by using the polymeric compound in all materials for the organic compound layers in manufacturing process of the device, and such a process is advantageous from the points of simplification of production, processability, increase in device area size, cost, and others, and the charge-transporting polyester allows expression of stabilized device characteristics, independently of the kind of the emitting material used for the emitting layer.

As a result, the organic EL device of the exemplary embodiment is superior in brightness, stability and durability and easier to produce, allows increase in device area size, gives a smaller number of defects during production, and shows smaller deterioration in device performance with time.

Hereinafter, the charge-transporting esters represented by Formulae (I-1) and (I-2) will be described.

The charge-transporting polyester has an ester bond unit higher in mobility than other bond units and thus has higher flexibility of its molecular structure, and thus is a material that is superior in thin film-forming efficiency, retains its flexibility of its molecular structure even when the molecular weight is raised for improvement in heat resistance, and allows film formation easily in a wet casting process.

As will be described below, it is possible to give the charge-transporting polyester any function, positive hole-transporting capability or electron-transporting capability, by proper selection of its molecular structure. For that reason, the polyester may be used for any layer, for example for a positive hole-transporting layer, an emitting layer, or a charge-transporting layer (carrier transport layer), according to application.

The charge-transporting polyester is particularly preferably a polyester having a positive hole-transporting capacity (positive hole-transporting polyester).

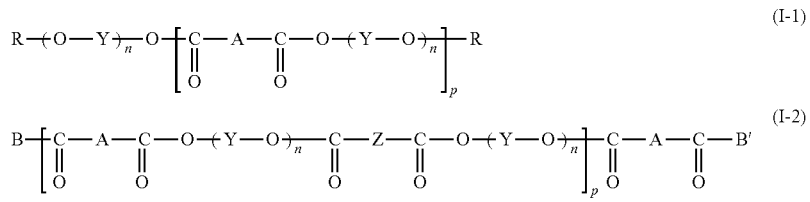

In Formulae (I-1) and (I-2), A represents at least one structure selected from the structures represented by the following Formulae (II-1) and (II-2); R represents a hydrogen atom, an alkyl group, a substituted or unsubstituted aryl group, or a substituted or unsubstituted aralkyl group; Y represents a dihydric alcohol residue; Z represents a divalent carboxylic acid residue; B and B' each independently represent a group —O—(Y—O)$_n$—R or a group —O—(Y—O)$_n$—CO—Z—CO—O—R' wherein R, Y, and Z are the same as those described above; R' represents an alkyl group, a substituted or unsubstituted aryl group, or a substituted or unsubstituted aralkyl group; and n is an integer of 1 to 5; n is an integer of 1 to 5; and p is an integer of 5 to 5,000.

In Formula (I-1) and (I-2), A represents at least one structure selected from the structures represented by the following Formulae (II-1) and (II-2); and two or more structures A may be present in one polymer.

The structures represented by the following Formulae (II-1) and (II-2) will be described in detail.

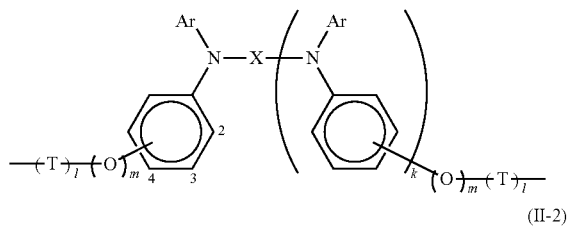

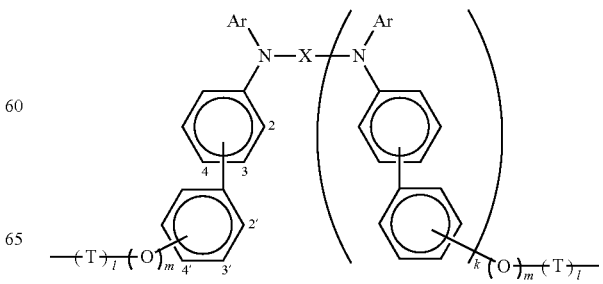

In Formulae (II-1) and (II-2), Ar represents a substituted or unsubstituted monovalent aromatic group; X represents a substituted or unsubstituted divalent aromatic group; k, m, and l each are 0 or 1; and T represents a divalent straight-chain hydrocarbon having 1 to 6 carbon atoms or a branched hydrocarbon having 2 to 10 carbon atoms.

In Formulae (II-1) and (II-2), Ar represents a substituted or unsubstituted monovalent aromatic group.
Specifically, Ar represents a substituted or unsubstituted phenyl group, a substituted or unsubstituted monovalent polynuclear aromatic hydrocarbon having 2 to 10 aromatic rings, a substituted or unsubstituted monovalent fused-ring aromatic hydrocarbon having 2 to 10 aromatic rings, a substituted or unsubstituted monovalent aromatic heterocyclic ring, or, a substituted or unsubstituted monovalent aromatic group containing at least one aromatic heterocyclic ring.

In Formulae (II-1) and (II-2), the number of the aromatic rings constituting the polynuclear aromatic hydrocarbon and the fused-ring aromatic hydrocarbon selected as the structure represented by Ar is not particularly limited, but preferably 2 to 5, and the fused-ring aromatic hydrocarbon is preferably a completely fused-ring aromatic hydrocarbon. In the exemplary embodiment, the polynuclear aromatic hydrocarbon and the fused-ring aromatic hydrocarbon are specifically the polycyclic aromatic compounds as defined below.

The "polynuclear aromatic hydrocarbon" is a hydrocarbon compound having two or more aromatic rings composed of carbon and hydrogen that are bound to each other by a carbon-carbon single bond. Specific examples thereof include biphenyl, terphenyl and the like.

Alternatively, the "fused-ring aromatic hydrocarbon" is a hydrocarbon compound having two or more aromatic rings composed of carbon and hydrogen that are bound to each other via a pair of two or more carbon atoms nearby connected to each other. Specific examples thereof include naphthalene, anthracene, phenanthrene, fluorene and the like.

The "aromatic heterocyclic ring" represents an aromatic ring containing an element other than carbon and hydrogen. The number of atoms constituting the ring skeleton (Nr) is preferably 5 and/or 6. The kinds and the number of the elements other than C (foreign elements) constituting the ring skeleton is not particularly limited, however the element is preferably, for example, S, N, or O, and two or more kinds of and/or two or more foreign atoms may be contained in the ring skeleton. In particular, heterocyclic rings having a five-membered ring structure, such as thiophene, thiofin and furan, a heterocyclic ring substituted with nitrogen at the 3- and 4-positions thereof, pyrrole, or a heterocyclic ring further substituted with nitrogen at the 3- and 4-positions, are used favorably, and heterocyclic rings having a six-membered ring structure such as pyridine are also used favorably.

The "aromatic group containing an aromatic heterocyclic ring" is a binding group having at least such an aromatic heterocyclic ring in the atomic group constituting the skeleton. The group may be an entirely conjugated system or a system at least partially non-conjugated, however an entirely conjugated system is favorable from the points of charge-transporting property and luminous efficiencies.

Examples of the substituents on the phenyl group, polynuclear aromatic hydrocarbon, fused-ring aromatic hydrocarbon, aromatic heterocyclic ring, or aromatic group containing an aromatic heterocyclic ring include a hydrogen atom, alkyl groups, alkoxy groups, a phenoxy group, aryl groups, aralkyl groups, substituted amino groups, halogen atoms and the like.

The alkyl group preferably has 1 to 10 carbon atoms, and examples thereof include methyl, ethyl, propyl, and isopropyl groups and the like. The alkoxyl group preferably has 1 to 10 carbon atoms, and examples thereof include methoxy, ethoxy, propoxy, and isopropoxy groups and the like. The aryl group preferably has 6 to 20 carbon atoms, and examples thereof include phenyl and toluoyl groups and the like. The aralkyl group preferably has 7 to 20 carbon atoms, and examples thereof include benzyl and phenethyl groups and the like. The substituent groups on the substituted amino group include alkyl, aryl, and aralkyl groups and the like, and specific examples thereof include those described above.

In Formulae (II-1) and (II-2), X represents a substituted or unsubstituted divalent aromatic group. Specific examples of the group X include substituted or unsubstituted phenylene groups, substituted or unsubstituted divalent polynuclear aromatic hydrocarbons having 2 to 10 aromatic rings, substituted or unsubstituted divalent fused-ring aromatic hydrocarbons having 2 to 10 aromatic rings, substituted or unsubstituted divalent aromatic heterocyclic rings, and substituted or unsubstituted divalent aromatic groups containing at least one aromatic heterocyclic ring.

The "polynuclear aromatic hydrocarbon", the "fused-ring aromatic hydrocarbon", the "aromatic heterocyclic ring", and the "aromatic group containing an aromatic heterocyclic ring" are the same as those described above.

In Formulae (II-1) and (II-2), k, l, and m are 0 or 1; T represents a divalent straight-chain hydrocarbon group having 1 to 6 carbon atoms or a divalent branched hydrocarbon group having 2 to 10 carbon atoms, preferably a group selected from divalent straight-chain hydrocarbon groups having 2 to 6 carbon atoms and divalent branched hydrocarbon groups having 3 to 7 carbon atoms. Specific structures of T are shown below.

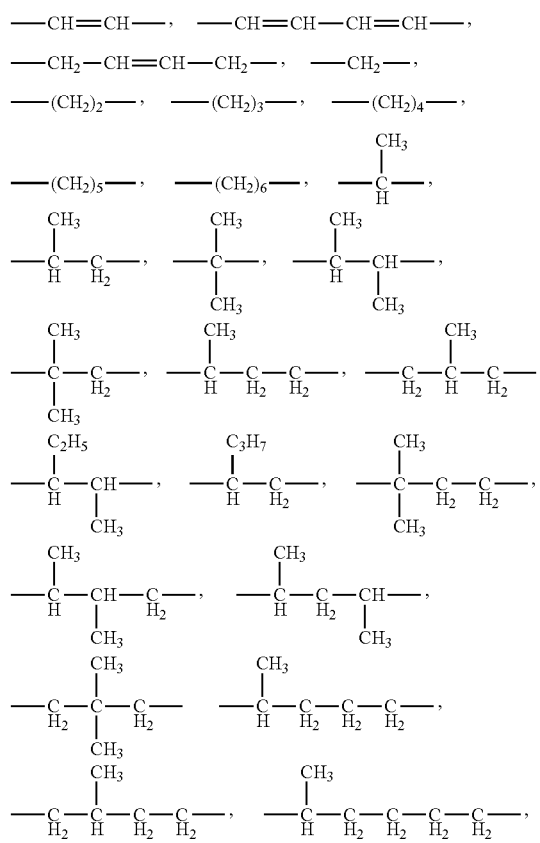

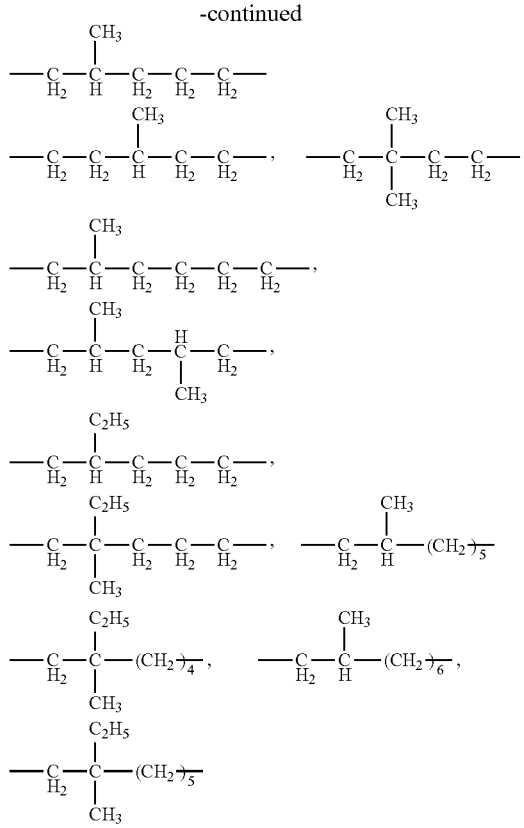

Hereinafter, the charge-transporting polyesters represented by Formulae (I-1) and (I-2) will be described in detail.

In Formulae (I-1) and (I-2), R represents a hydrogen atom, an alkyl group, a substituted or unsubstituted aryl group, or a substituted or unsubstituted aralkyl group.

The alkyl group preferably has 1 to 10 carbon atoms, and examples thereof include methyl, ethyl, propyl, and isopropyl groups and the like. The aryl group preferably has 6 to 20 carbon atoms, and examples thereof include phenyl and toluoyl groups and the like, and the aralkyl group preferably has 7 to 20 carbon atoms, and examples thereof include benzyl and phenethyl groups and the like. The substituent groups on the substituted aryl group or the substituted aralkyl group include a hydrogen atom, alkyl groups, alkoxy groups, substituted amino groups, halogen atoms, and the like.

In Formula (I-1) or (I-2), Y represents a dihydric alcohol residue; and Z represents a divalent carboxylic acid residue. Specifically, Y and Z are the groups selected from the groups represented by the following Formulae (1) to (7).

—(CH$_2$)$_a$— (1)

—(CH$_2$CH$_2$O)$_b$—(CH$_2$CH$_2$)$_c$— (2)

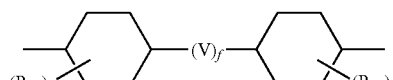 (3)

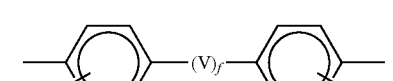 (4)

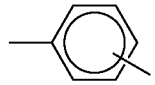 (5)

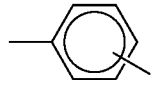 (6)

 (7)

In Formulae (1) to (7), R$_{11}$ and R$_{12}$ each represent a hydrogen atom, an alkyl group having 1 to 4 carbon atoms, an alkoxyl group having 1 to 4 carbon atoms, a substituted or unsubstituted phenyl group, a substituted or unsubstituted aralkyl group, or a halogen atom; each of a, b, and c is an integer of 1 to 10; each of d and e is an integer of 0, 1 or 2; each f is 0 or 1; and V represents a group selected from the groups represented by the following Formulae (8) to (18).

—(CH$_2$)$_g$— (8)

—C(CH$_3$)$_2$— (9)

—O— (10)

—S— (11)

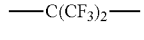 (12)

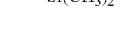 (13)

—C(CF$_3$)$_2$— (14)

—Si(CH$_3$)$_2$— (15)

—CH=CH— (16)

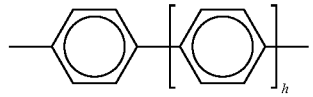 (17)

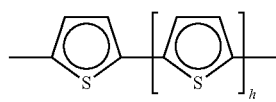 (18)

In Formulae (8) to (18), each g is an integer of 1 to 10; and each h is an integer of 0 to 10.

In Formula (I-1) and (I-2), n is an integer of 1 to 5; and p indicating polymerization degree is in the range of 5 to 5,000, preferably in the range of 10 to 1,000.

The weight average molecular weight Mw of the charge-transporting polyester is preferably in the range of 5,000 to 1,000,000, more preferably in the range of 10,000 to 300,000.

The weight average molecular weight Mw can be determined by the following method:

The weight-average molecular weight is determined, by first preparing a 1.0% by weight charge-transporting polyester THF (tetrahydrofuran) solution and analyzing the solution by gel penetration chromatography (GPC) by using a differential refractometer (RI, manufactured by TOSOH corp., trade name: UV-8020) while styrene polymers is used as calibration samples.

Favorably in Formulae (I-1), (I-2), (II-1) and (II-2) described above from the points of processability and basic physical properties satisfying the device characteristics, in Formulae (I-1) and (I-2), R represents a methyl or ethyl group; Y represents a dihydric alcohol residue; Z represents a divalent carboxylic acid residue; each of B and B' represents a methyl or ethyl group similarly to R; n is 1; and p is an integer of 10 to 1,000;
in Formula (II-1) and (II-2) represented by A, Ar represents a phenyl, biphenyl, naphthalene, or 9,9'-dimethylfluorene group (the substituent group of the aromatic ring is preferably a methyl, ethyl, isopropyl, tert-butyl, or methoxy group); X represents a group represented by the following Formula (19) to (20);

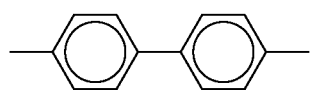

(19)

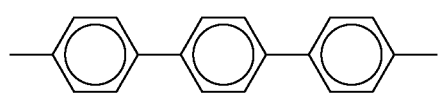

(20)

k is 1; m is 0; l is 1; and T represents a methylene or dimethylene group.

Specific examples of the charge-transporting polyesters represented by Formulae (I-1) and (I-2) include those disclosed in Japanese Patent Nos. 2,894,257, 2,865,020, 2,865,029, 3,267,115 and 3,058,069, and others.

Hereinafter, the method of preparing the charge-transporting polyester will be described. The charge-transporting polyester is prepared by polymerizing a charge-transporting monomer represented by the following formula (V-1) or (V-2) by a known method, for example described in New Experimental Chemistry, 4th Ed., No. 28 (Maruzen, 1992).

In Structural Formula (V-1) or (V-2), A' represents a hydroxyl group, a halogen atom, an alkoxyl group [—$OR_{13}$, wherein $R_{13}$ represents an alkyl group (e.g., methyl group, ethyl group)]; and Ar, X, T, k, l, and m are the same as those in Formula (II-1) or (II-2) above.

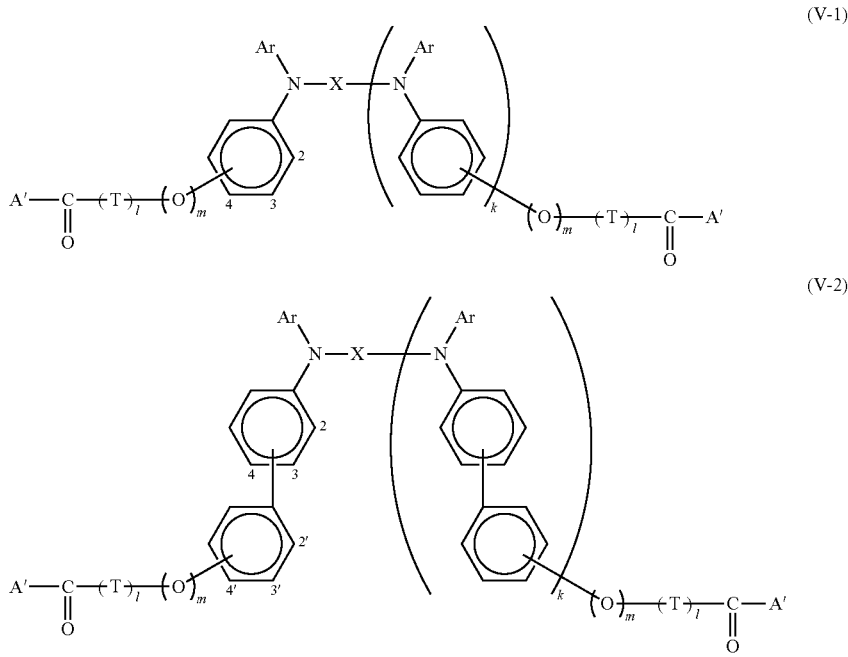

The charge-transporting polyester represented by Formula (I-1) is prepared in the following manner:

When A' is a hydroxyl group, a charge-transporting monomer represented by Structural Formula (V-1) or (V-2) and a dihydric alcohol represented by HO—(Y—O)$_n$—H (Y and n are the same as those shown in Formula (I-1) and (I-2). the same shall apply below) are mixed in the equivalent weight, and the mixture is polymerized in the presence of an added acid catalyst. A common acid catalyst for esterification reaction, such as sulfuric acid, toluenesulfonic acid, or trifluoroacetic acid, may be used as the acid catalyst, and is used in an amount in the range of 1/10,000 to 1/10 part by weight, preferably in the range of 1/1,000 to 1/50 part by weight, with respect to 1 part by weight of the charge-transporting monomer. Use of a solvent azeotropic with water is preferable for removal of water generated during polymerization; toluene, chlorobenzene, 1-chloronaphthalene, and the like are effective; and it is used in an amount of 1 to 100 parts by weight, preferably in the range of 2 to 50 parts by weight, with respect to 1 part by weight of the charge-transporting monomer. The reaction temperature can be arbitrarily set, and it is preferable to perform the reaction at the boiling point of the solvent for removal of water generated during polymerization.

After reaction, when no solvent is used, the mixture is dissolved in a good solvent. When a solvent is used, the reaction solution is added dropwise as it is, into a poor solvent for polymer such as alcohol (such as methanol or ethanol) or acetone, allowing precipitation of the charge-transporting polyester, and, after separation, the charge-transporting polyester is washed with water and an organic solvent thoroughly and dried. If needed, the reprecipitation processing may be repeated, by dissolving the polyester in a suitable organic solvent and adding the solution dropwise into a poor solvent, thus, precipitating the charge-transporting polyester. During the reprecipitation processing, the reaction mixture is preferably stirred thoroughly, for example, with a mechanical stirrer. The solvent for dissolving the charge-transporting polyester during the reprecipitation processing is preferably used in an amount in the range of 1 to 100 parts by weight, preferably in the range of 2 to 50 parts by weight, with respect to 1 part by weight of the charge-transporting polyester. The poor solvent is used in an amount in the range of 1 to 1,000 parts by weight, preferably in the range of 10 to 500 parts by weight, with respect to 1 part by weight of the charge-transporting polyester.

When A' is a halogen atom, a charge-transporting monomer represented by Structural Formula (V-1) or (V-2) and a dihydric alcohols represented by HO—$(Y—O)_n$—H in the same amounts are mixed with each other, and an organic basic catalyst such as pyridine or triethylamine is added thereto for polymerization. The organic base catalyst is used in an amount in the range of 1 to 10 equivalences, preferably 2 to 5 equivalence, with respect to 1 part by weight of the charge-transporting monomer. Examples of favorable solvents include methylene chloride, tetrahydrofuran (THF), toluene, chlorobenzene, 1-chloronaphthalene, and the like, and it is used in an amount in the range of 1 to 100 parts by weight, preferably in the range of 2 to 50 parts by weight, with respect to 1 part by weight of the charge-transporting monomer. The reaction temperature can be arbitrarily set. After polymerization, the reaction mixture is subjected to the reprecipitation processing described above for purification.

When a dihydric alcohol such as bisphenol higher in acidity than other solvents is used, an interfacial polymerization may be used instead. Thus, a dihydric alcohol is added to and dissolved in water with an equivalent amount of a base, and a charge-transporting monomer solution in an amount equivalent to the dihydric alcohol is added thereto, while the mixture is agitated vigorously for polymerization. Water is then used in an amount in the range of 1 to 1,000 parts by weight, preferably in the range of 2 to 500 parts by weight, with respect to 1 part by weight of the dihydric alcohol. Examples of the solvents effectively dissolving the charge-transporting monomer include methylene chloride, dichloroethane, trichloroethane, toluene, chlorobenzene, 1-chloronaphthalene, and the like. The reaction temperature can be arbitrarily set, and use of a phase-transfer catalyst such as ammonium salt or sulfonium salt is effective for accelerating the reaction. The phase-transfer catalyst is used in an amount in the range of 0.1 to 10 parts by weight, preferably in the range of 0.2 to 5 parts by weight, with respect to 1 part by weight of the positive hole-transporting monomer.

When A' is an alkoxyl group, a charge-transporting monomer represented by Structural Formula (V-1) or (V-2) and an excess amount of a dihydric alcohol represented by HO—$(Y—O)_n$—H are added, and the mixture is heated in the presence of a catalyst such as an inorganic acid (such as sulfuric acid or phosphoric acid), an titanium alkoxide, an acetate or carbonate salt of calcium, cobalt, or the like, or an oxide of zinc or lead, for preparation by ester exchange. The dihydric alcohol is used in an amount in the range of 2 to 100 equivalences, preferably in the range of 3 to 50 equivalences, with respect to 1 part by weight of the charge-transporting monomer.

The catalyst is used in an amount in the range of 1/10,000 to 1 part by weight, preferably in the range of 1/1,000 to 1/2 part by weight, with respect to 1 part by weight of the charge-transporting monomer represented by Structural Formula (V-1) or (V-2). The reaction is carried out at a reaction temperature of 200 to 300° C., and, after ester exchange of its alkoxyl group with the group —O—$(Y—O)_n$—H, the system is preferably placed under reduced pressure for acceleration of polymerization by release of HO—$(Y—O)_n$—H, A high-boiling-point solvent azeotropic with HO—$(Y—O)_n$—H such as 1-chloronaphthalene may be used for reaction while the HO—$(Y—O)_n$—H is removed azeotropically under atmospheric pressure.

The charge-transporting polyester represented by Formula (I-2) is synthesized, for example, by using a charge-transporting monomer represented by the following structural formula (VI-1) or (VI-2).

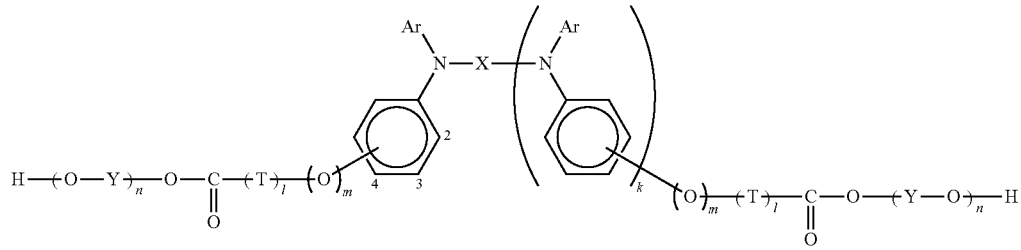

(VI-1)

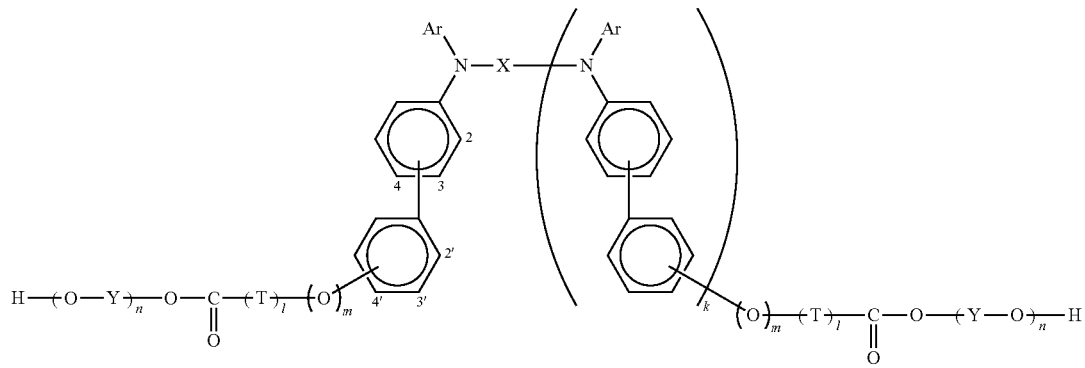

(VI-2)

In Structural Formula (VI-1) or (VI-2), Ar, X, Y, T, k, l, m, and n are the same as those described above.

The charge-transporting polyester represented by Formula (I-2) is prepared in the following manner:

First, an excess amount of a dihydric alcohol represented by HO—(Y—O)$_n$—H above is added to a charge-transporting monomer represented by Structural Formula (V-1) or (V-2) wherein A' may be a hydroxyl group, a halogen atom, or an alkoxyl group, for reaction, to give a charge-transporting monomer represented by Structural Formula (VI-1) or (VI-2).

Then, a charge-transporting polyester represented by Formula (I-2) is prepared in a similar manner to the charge-transporting polyester represented by the Formula (I-1), by allowing a charge-transporting monomer represented by Structural Formula (VI-1) or (VI-2) in place of the charge-transporting monomeric represented by Structural Formula (V-1) or (V-2), to react, for example, with a divalent carboxylic acid or a divalent carboxylic halide.

Hereinafter, the charge injection material containing a substituted silicon group represented by Formula (III) will be described.

The charge injection material containing the substituted silicon group represented by Formula (III), which contains, for example, a substituted silicon group having a hydrolytic group, is a three-dimensionally crosslinking material that causes a crosslinking reaction, forming three dimensional —Si—O—Si— bonds, i.e., an inorganic glassy network structure (network).

In Formula (III), $R_1$ represents a hydrogen atom, an alkyl group, or a substituted or unsubstituted aryl group. Q represents a hydrolytic group. a is an integer of 1 to 3.

In Formula (III), the alkyl group represented by $R_1$ is, for example, an alkyl group having 1 to 10 carbon atoms, and examples thereof include methyl, ethyl, propyl, and isopropyl groups and the like.

In Formula (III), the aryl group represented by $R_1$ preferably has 6 to 20 carbon atoms, and examples thereof include phenyl and toluoyl groups and the like. The substituent groups of the aryl group include alkyl groups, alkoxy groups, a phenoxy group, aryl groups, aralkyl groups, substituted amino groups, halogen atoms and the like.

The alkyl group of the substituent group on aryl group is preferably an alkyl group having 1 to 10 carbon atoms, and examples thereof include methyl, ethyl, propyl, and isopropyl groups and the like. The alkoxyl group preferably has 1 to 10 carbon atoms, and examples thereof include methoxy, ethoxy, propoxy, and isopropoxy groups and the like. The aryl group preferably has 6 to 20 carbon atoms, and examples thereof include phenyl and toluoyl groups and the like. The aralkyl group preferably has 7 to 20 carbon atoms, and examples thereof include benzyl and phenethyl groups and the like. The substituent groups of the substituted amino group include alkyl groups, aryl groups, aralkyl groups, and the like, and specific examples are the same as those described above (see Formulae (I-1) and (I-2)).

Examples of the hydrolytic groups represented by Q include alkoxy groups, a methylethylketoxime group, a diethylamino group, an acetoxy group, a propenoxy group, halogen atoms and the like. The alkoxy group preferably has 1 to 10 carbon atoms, and examples thereof include methoxy, ethoxy, propoxy, and isopropoxy groups and the like.

Specific examples of the charge injection material containing a substituted silicon group represented by Formula (III) include aromatic compounds such as tetraphenylenediamine derivatives, triphenylamine derivatives, carbazole derivatives, stilbene derivatives, and arylhydrazone derivatives. Among them, aromatic amine compounds represented by the following Formulae (IV-1) to (IV-4) are preferable.

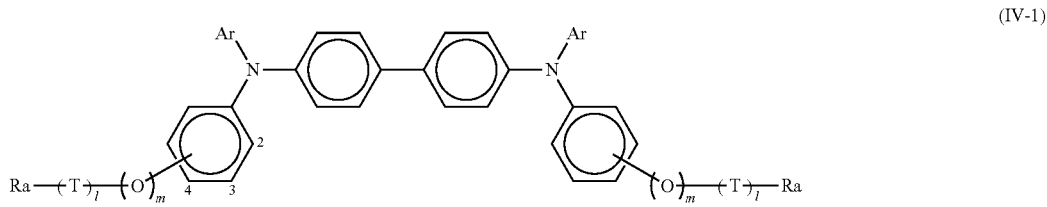

(IV-1)

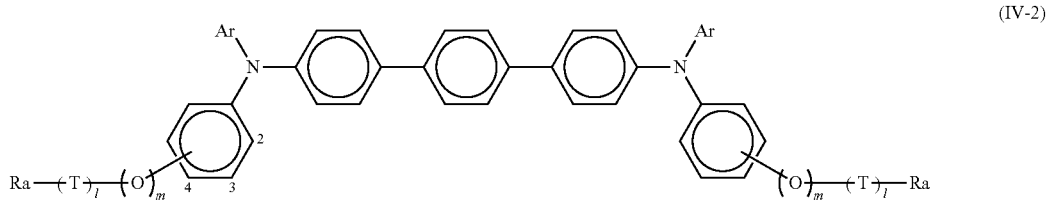

(IV-2)

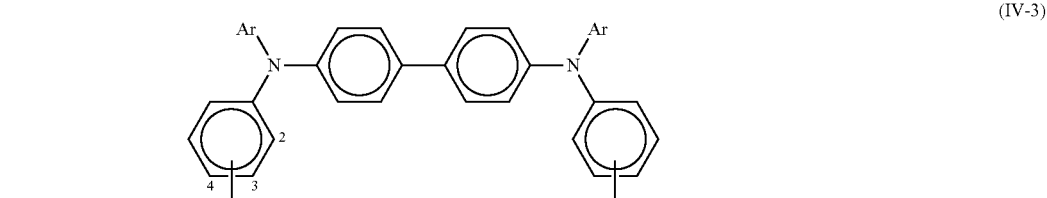

(IV-3)

-continued

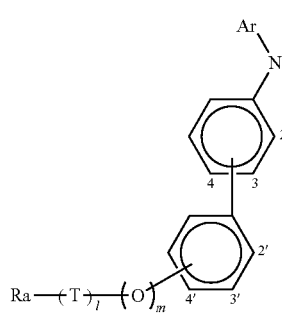 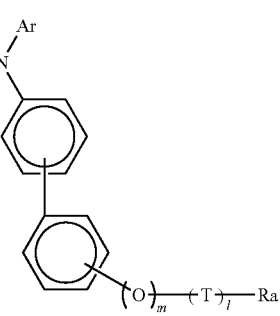

(IV-4)

In Formulae (IV-1) to (IV-4), Ar represents a substituted or unsubstituted monovalent aromatic group; Ra represents at least one substituted silicon group represented by Formula (III); m and l are 0 or 1; and T represents a divalent straight-chain hydrocarbon having 1 to 6 carbon atoms or a branched hydrocarbon having 2 to 10 carbon atoms.

In Formulae (IV-1) to (IV-4), Ar represents a substituted or unsubstituted monovalent aromatic group. Specifically, Ar represents a substituted or unsubstituted phenyl group, a substituted or unsubstituted monovalent polynuclear aromatic hydrocarbon having 2 to 10 aromatic rings, a substituted or unsubstituted monovalent fused-ring aromatic hydrocarbon having 2 to 10 aromatic rings, a substituted or unsubstituted monovalent aromatic heterocyclic ring, or, a substituted or unsubstituted monovalent aromatic group containing at least one aromatic heterocyclic ring.

The "polynuclear aromatic hydrocarbon", the "fused-ring aromatic hydrocarbon", the "aromatic heterocyclic ring", and the "aromatic group containing an aromatic heterocyclic ring" are the same as those described above.

In Formula (IV-1) to (IV-4), l and m are 0 or 1; and T represents a divalent straight-chain hydrocarbon having 1 to 6 carbon atoms or a divalent branched hydrocarbon group having 2 to 10 carbon atoms, preferably a group selected from divalent straight-chain hydrocarbon groups having 2 to 6 carbon atoms and divalent branched hydrocarbon groups having 3 to 7 carbon atoms. Specific structures of T are the same as those described above.

The aromatic amine compounds described above represented by Formulae (IV-1) to (IV-4) have a substituted silicon group represented by Formula (III) via a covalent bond at the terminal, and are three-dimensionally crosslinking charge-transporting materials having the aromatic amine structural unit that can form a three-dimensionally crosslinked product.

The aromatic amine structures in Formulae (IV-1) and (IV-2) are biphenyl or terphenyl derivatives of the regions represented by X in the structure represented by Formula (II-1), and the aromatic amine structures in Formulae (IV-3) and (IV-4) are biphenyl or terphenyl derivatives of the region represented by X in Formula (II-2).

Preferably in the aromatic amine compounds represented by Formulae (IV-1) to (IV-4), Ar represents a phenyl, biphenyl, naphthalene, or 9,9'-dimethylfluorene group (the substituent group on the aromatic ring is preferably a methyl, ethyl, isopropyl, tert-butyl, or methoxy group); m is 0; l is 1; T represents a methylene or dimethylene group; and Ra represents —Si(OCH$_3$)$_3$ or —SiH(OCH$_3$)$_2$.

Specific examples of the aromatic amine compounds represented by Formulae (IV-1) to (IV-2) include the followings:

TABLE 1

| No. | Ar | l | m | T | Ra | Binding site |
|---|---|---|---|---|---|---|
| 1. | phenyl | 1 | 0 | —(CH$_2$)$_2$— | —Si(OCH$_3$)$_3$ | 4 |
| 2. | phenyl | 1 | 0 | —(CH$_2$)$_2$— | —Si(OCH$_3$)$_3$ | 3 |
| 3. | phenyl | 1 | 1 | —(CH$_2$)$_2$— | —Si(OCH$_3$)$_3$ | 4 |
| 4. | phenyl | 1 | 0 | —(CH$_2$)$_2$— | —SiH(OCH$_3$)$_2$ | 4 |
| 5. | biphenyl | 1 | 0 | —(CH$_2$)$_2$— | —Si(OCH$_3$)$_3$ | 4 |

TABLE 1-continued

| No. | Ar | l | m | T | Ra | Binding site |
|---|---|---|---|---|---|---|
| 6. | H₃C-, -OCH₃ phenyl | 1 | 0 | —(CH₂)₂— | —Si(OCH₃)₃ | 4 |
| 7. | H₃C-, -OCH₃ phenyl | 1 | 0 | —(CH₂)₂— | —SiH(OCH₃)₂ | 4 |
| 8. | H₃C-, -OCH₃ phenyl | 1 | 0 | —(CH₂)₂— | —Si(OC₂H₅)₃ | 4 |
| 9. | biphenyl-OCH₃ | 1 | 0 | —(CH₂)₂— | —Si(OCH₃)₃ | 4 |
| 10. | 9,9-dimethylfluorenyl | 1 | 0 | —(CH₂)₂— | —Si(OCH₃)₃ | 4 |
| 11. | 9,9-dimethylfluorenyl | 1 | 0 | —(CH₂)₂— | —SiH(OCH₃)₂ | 4 |
| 12. | naphthyl | 1 | 0 | —(CH₂)₂— | —Si(OCH₃)₃ | 4 |
| 13. | naphthyl | 1 | 0 | —(CH₂)₂— | —Si(OCH₃)₃ | 4 |

Specific examples of the aromatic amine compounds represented by Formulae (IV-3) to (IV-4) include the followings:

TABLE 2

| No. | Ar | l | m | T | Ra | Binding site |
|---|---|---|---|---|---|---|
| 1. | phenyl | 1 | 0 | —(CH₂)₂— | —Si(OCH₃)₃ | 4,4' |
| 2. | biphenyl | 1 | 0 | —(CH₂)₂— | —Si(OCH₃)₃ | 4,4' |

TABLE 2-continued

| No. | Ar | l | m | T | Ra | Binding site |
|---|---|---|---|---|---|---|
| 3. | H₃C—⟨phenyl⟩—OCH₃ | 1 | 0 | —(CH₂)₂— | —Si(OCH₃)₃ | 4,4' |
| 4. | H₃C—⟨phenyl⟩—OCH₃ | 1 | 0 | —(CH₂)₂— | —Si(OC₂H₅)₃ | 4,4' |
| 5. | 9,9-dimethylfluorenyl (H₃C, CH₃) | 1 | 0 | —(CH₂)₂— | —Si(OCH₃)₃ | 4,4' |
| 6. | naphthyl | 1 | 0 | —(CH₂)₂— | —Si(OCH₃)₃ | 4,4' |
| 7. | naphthyl | 1 | 0 | —(CH₂)₂— | —Si(OCH₃)₃ | 4,4' |

Hereinafter, the layer structure of the organic electroluminescent device in the exemplary embodiment will be described in detail. The organic electroluminescent device in the exemplary embodiment has a layer structure of electrodes of an anode and cathode at least one of which is transparent or translucent and an organic compound layer consisting of two or more layers including an emitting layer and a buffer layer disposed between the pair of electrodes. The buffer layer, which contains one or more charge injection materials substituted silicon group represented by Formula (III), is provided in contact with the anode. At least one of the organic compound layers other than the buffer layer contains at least one of the charge-transporting polyesters represented by Formula (I-1) or (I-2) above.

In addition, the organic compound layer located closest to the anode, among the organic compound layers containing the charge-transporting polyester, has a film thickness preferably in the range of from 20 nm to 100 nm (more preferably from 20 nm to 80 nm, and still more preferably from 20 nm to 50 nm). Preferably, the organic compound layer is an emitting layer having a charge-transporting capability when the organic compound layer is a single-layer, and a positive hole-transporting layer when it is a functionally separated layer (laminate).

In the organic electroluminescent device in the exemplary embodiment, when the organic compound layer is made only of a buffer layer and an emitting layer, the light-emitting layer means an emitting layer having a charge-transporting capability, and the light-emitting layer having a charge-transporting capability contains the charge-transporting polyester.

Alternatively when the organic compound layer has a buffer layer and an emitting layer, as well as additional one or more other layers (3 or more functionally separated layers), each of the other layers excluding the buffer and light-emitting layers means a carrier transport layer, i.e., a positive hole-transporting layer, an electron-transporting layer, or a positive hole- and electron-transporting layer, and at least one of the layers contains the charge-transporting polyester.

Specifically, the organic compound layer may have, for example, a configuration including at least a buffer layer, an emitting layer and an electron-transporting layer, a configuration including at least a buffer layer, a positive hole-transporting layer, an emitting layer and an electron-transporting layer, or a configuration including at least a buffer layer, a positive hole-transporting layer and an emitting layer. In such a case, at least one layer thereof (positive hole-transporting layer, electron-transporting layer, or light-emitting layer) preferably contains the charge-transporting polyester, however favorably, the charge-transporting polyester is the positive hole-transporting material. In particular, at least the light-emitting layer or the positive hole-transporting layer in contact with the buffer layer preferably contains the charge-transporting polyester.

When the organic compound layer is made only of a buffer layer and an emitting layer, the buffer layer is provided between the anode and the light-emitting layer. Alternatively when it contains at least a buffer layer, an emitting layer and an electron-transporting layer, the buffer layer is provided between the anode and the light-emitting layer. Alternatively when it contains at least a buffer layer, a positive hole-transporting layer, an emitting layer and an electron-transporting layer, the buffer layer is provided between the anode and the positive hole-transporting layer. Yet alternatively when it contains at least a buffer layer, a positive hole-transporting layer and an emitting layer, the buffer layer is provided between the anode and the positive hole-transporting layer.

The processability and the luminous efficiency are both more favorable in the configuration containing a buffer layer, an emitting layer and an electron-transporting layer than in other layer structures. The number of layers is smaller in the configuration than in the completely functionally separated layer structures; the mobility of electron, which is generally lower than that of positive hole, is elevated; and thus, the charges are seemingly balanced in the light-emitting layer.

The device in the configuration including a buffer layer, a positive hole-transporting layer, an emitting layer and an electron-transporting layer is superior in luminous efficiency to the devices in other layer structures, and allows low-voltage drive. Seemingly it is because the charge injection efficiency is highest in the layer structure of entire functional separation than other layer structures, and the charges are recombined in the light-emitting layer.

Both the processability and the durability are more favorable in the configuration including a buffer layer, a positive hole-transporting layer and an emitting layer than in other configurations. Seemingly it is because the number of layers is smaller in the configuration than in entirely functionally separated layer structures, the hole injection efficiency into the light-emitting layer is improved, and injection of excessive electron in the light-emitting layer is prevented.

Increase in the area and production of the device are easier in the configuration including only a buffer layer and an emitting layer than in other layer structures. It is because the number of layers is smaller and the device can be produced, for example, by wet coating.

In the organic electroluminescent device in the exemplary embodiment, the light-emitting layer may contain a charge-transporting material (positive hole- or electron-transporting material other than the charge-transporting polyester), and the charge-transporting material will be described below in detail.

Hereinafter, the organic electroluminescent device in the exemplary embodiment will be described in more detail with reference to drawings, however the invention is not limited by these embodiments.

Figure 2:
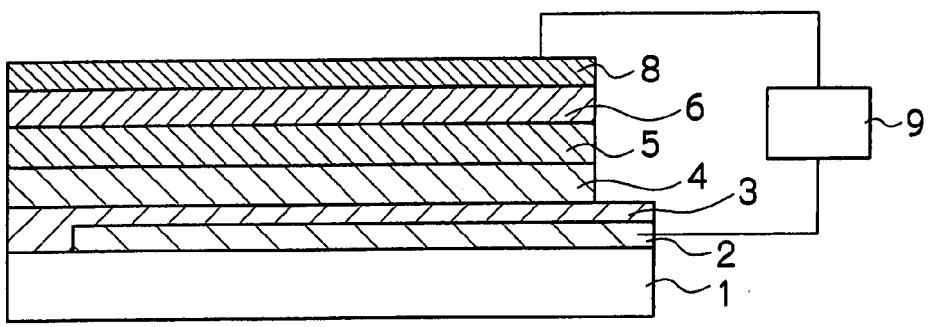
FIG. 2 is a schematic sectional view illustrating another example of layer structure of organic electroluminescent device of an exemplary embodiment.
Figure 3:
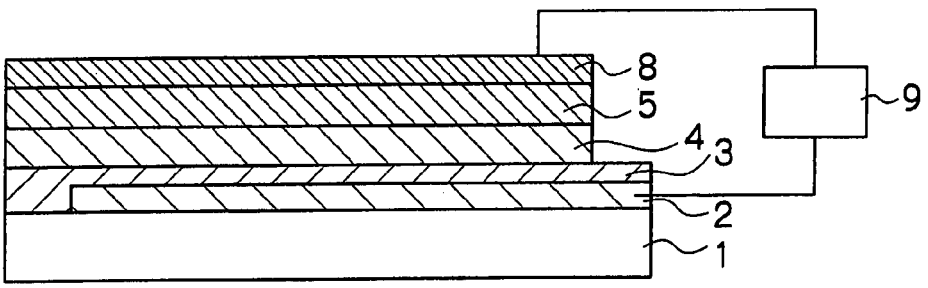
FIG. 3 is a schematic sectional view illustrating another example of layer structure of organic electroluminescent device of an exemplary embodiment.
Figure 4:
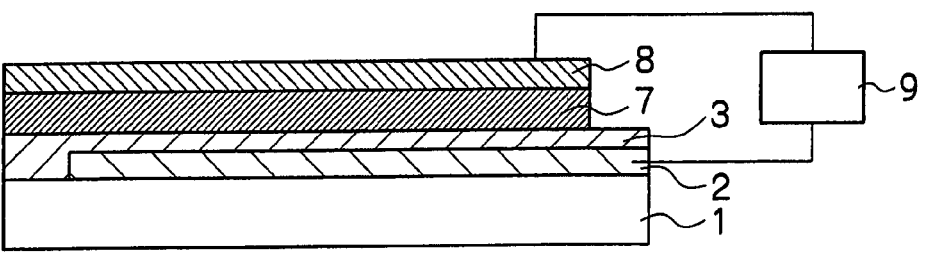
FIG. 4 is a schematic sectional view illustrating another example of layer structure of organic electroluminescent device of an exemplary embodiment.

FIGS. 1 to 4 are schematic sectional views illustrating the layer structure of the organic electroluminescent devices according to aspects of the invention, and FIGS. 1, 2, and 3 shows examples of the devices having three or four organic compound layers, while FIG. 4 shows an example of the device having two organic compound layers. The invention will be described hereinafter, as the same codes are allocated to the units having the same function in FIGS. 1 to 4.

The organic electroluminescent device shown in FIG. 1 has a transparent insulator substrate 1, and a transparent electrode 2, a buffer layer 3, an emitting layer 5, an electron-transporting layer 6 and a rear-face electrode 8 formed thereon successively.

The organic electroluminescent device shown in FIG. 2 has a transparent insulator substrate 1, and a transparent electrode 2, a buffer layer 3, a positive hole-transporting layer 4, an emitting layer 5, an electron-transporting layer 6 and a rear-face electrode 8 formed thereon successively.

The organic electroluminescent device shown in FIG. 3 has a transparent insulator substrate 1, and a transparent electrode 2, a buffer layer 3, a positive hole-transporting layer 4, an emitting layer 5 and a rear-face electrode 8 formed thereon in this order.

The organic electroluminescent device shown in FIG. 4 has a transparent insulator substrate 1, and a transparent electrode 2, a buffer layer 3, a charge-transporting light-emitting layer 7, and a rear-face electrode 8 formed thereon in this order.

In FIGS. 1 to 4, the transparent electrode 2 is an anode, and the rear-face electrode 8 is a cathode. Hereinafter, each component will be described in detail.

The layer containing the charge-transporting polyester may function as an emitting layer 5 or an electron-transporting layer 6, depending on its structure, in the layer structure of the organic electroluminescent device shown in FIG. 1; as a positive hole-transporting layer 4 or an electron-transporting layer 6, in the layer structure of the organic electroluminescent device shown in FIG. 2; as a positive hole-transporting layer 4 or an emitting layer 5, in the layer structure of the organic electroluminescent device shown in FIG. 3; and as an emitting layer 7 having a charge-transporting capability in the layer structure of the organic electroluminescent device shown in FIG. 4. In particular, the charge-transporting polyester functions favorably as a positive hole-transporting material.

The transparent insulator substrate 1 is preferably transparent for light transmission, and examples thereof include, but are not limited to, glass, plastic film, and the like. The transparent electrode 2 is also preferably transparent for light transmission, similarly to the transparent insulator substrate, and has a large work function (ionization potential) for hole injection, and examples thereof include, but are not limited to, oxide layers such as of indium tin oxide (ITO), tin oxide (NESA), indium oxide, and zinc oxide, and metal films, such as of gold, platinum, and palladium, formed by vapor deposition or sputtering.

The buffer layer 3, which is formed in contact with the anode (transparent electrode 2), contains one or more charge injection materials. The charge injection material containing the substituted silicon group is used as the charge injection material. Specifically, for example, the buffer layer 3 contains a three-dimensionally crosslinked product formed with the charge injection material containing the substituted silicon group.

The charge injection material preferably has an ionization potential of 5.2 eV or less, more preferably 5.1 eV or less, for improvement in the efficiency of injecting electron into the layer provided in contact with the face opposite to the anode of the buffer layer 3 (i.e., light-emitting layer 5 in FIG. 1, positive hole-transporting layer 4 in FIGS. 2 and 3, and charge-transporting light-emitting layer 7 in FIG. 4). The number of the buffer layers 3 is also not particularly limited, but preferably 1 or 2, particularly preferably 1.

Examples of the materials for constituting the buffer layer 3 include the materials described above, and other non-charge injection materials such as binder resins may be used as needed.

The electron-transporting layer 6 may be formed only with the charge-transporting polyester with an added function (electron-transporting capability) according to applications, but may be formed together with an electron-transporting material other than the charge-transporting polyester in an amount in the range of 1 to 50 wt %, for example for further improvement in electrical characteristics for control of electron transfer efficiency.

Favorable examples of the electron-transporting materials include oxadiazole derivatives, triazole derivatives, phenylquinoxaline derivatives, nitro-substituted fluorenone derivatives, diphenoquinone derivatives, thiopyranedioxide derivatives, fluorenylidenemethane derivatives and the like. Specifically favorable examples thereof include, but are not limited to, the following compounds (VII-1) to (VII-3): When the electron-transporting layer 6 is formed without use of the charge-transporting polyester, the electron-transporting layer 6 is formed with the electron-transporting material.

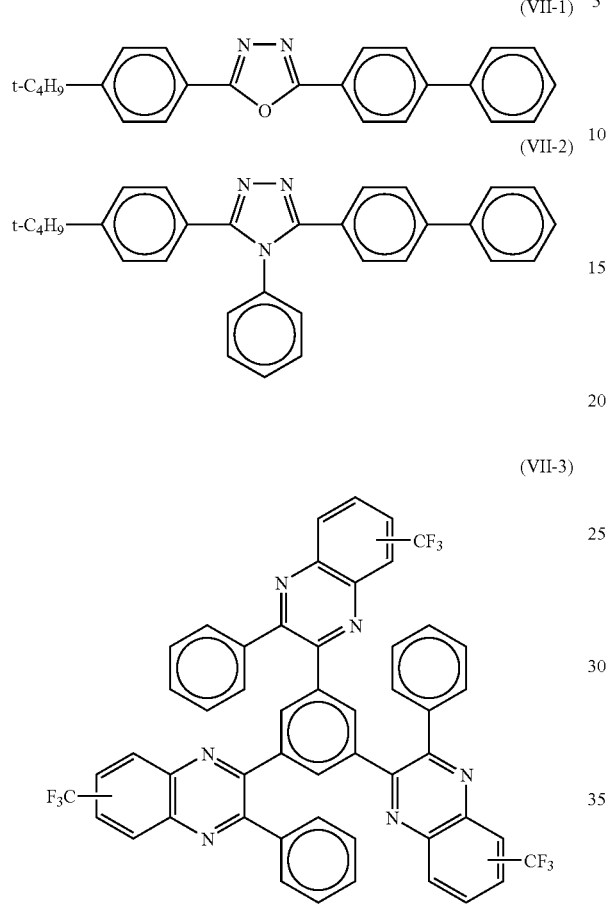

The positive hole-transporting layer 4 may be formed only with a charge-transporting polyester with an added functional (positive hole-transporting capability) according to applications, but may be formed together with a positive hole-transporting material other than the charge-transporting polyester in an amount in the range of 1 to 50 wt %, for control of the positive hole mobility.

Favorable examples of the positive hole-transporting materials include tetraphenylenediamine derivatives, triphenylamine derivatives, carbazole derivatives, stilbene derivatives, arylhydrazone derivatives, porphyrin-based compounds, and the like, and particularly favorable specific examples thereof include the following compounds (VIII-1) to (VIII-7), and tetraphenylenediamine derivative are particularly preferable, because they are superior in compatibility with the charge-transporting polyester. The material may be used as mixed, for example, with another common resin. When the positive hole-transporting layer 4 is formed without using the charge-transporting polyester, the positive hole-transporting layer 4 is formed with the positive hole-transporting material. In the compound (VII-7), n (integer) is preferably in the range of 10 to 100,000, more preferably in the range of 1,000 to 50,000.

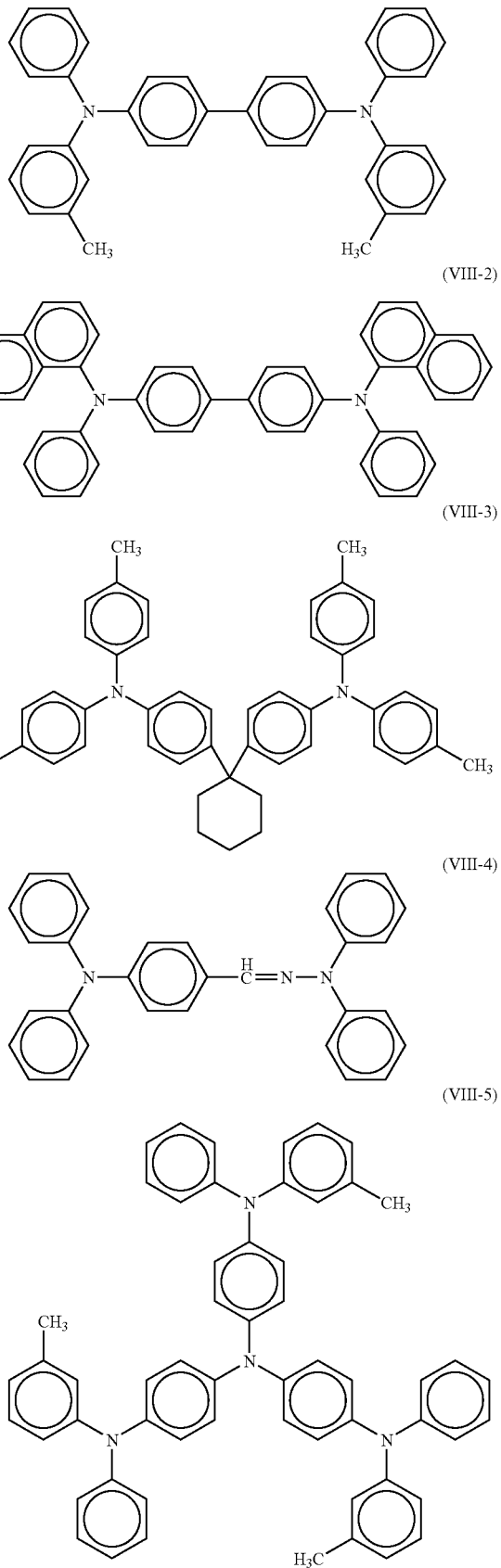

(VIII-6)

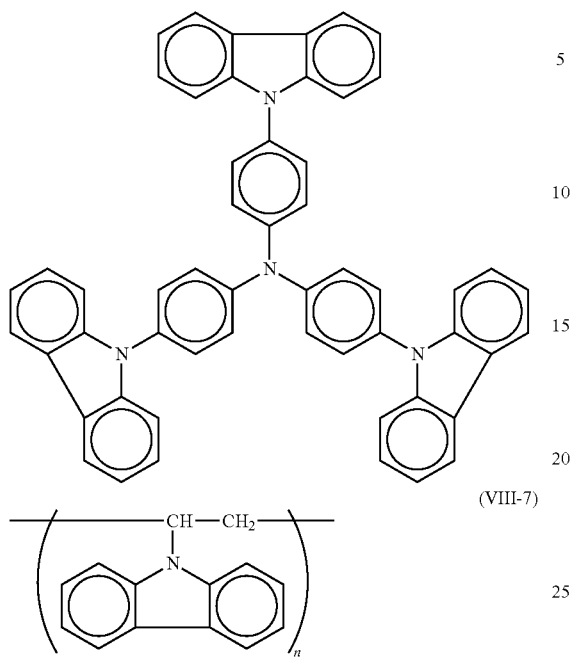

(VIII-7)

A compound having a fluorescence quantum yield higher than that of other compounds in the solid state is used as the light-emitting material in the light-emitting layer 5. When the light-emitting material is an organic low-molecular weight, the compound should give a favorable thin film by vacuum deposition or by coating/drying of a solution or dispersion containing a low-molecular weight compound and a binder resin. Alternatively when it is a polymer, it should give a favorable thin film by coating/drying of a solution or dispersion containing it.

If it is an organic low-molecular weight compound, favorable examples thereof include chelating organic metal complexes, polynuclear or fused aromatic ring compounds, perylene derivatives, coumarin derivatives, styryl arylene derivatives, silole derivatives, oxazole derivatives, oxathiazole derivatives, oxadiazole derivatives, and the like, and when it is a polymer, examples thereof include poly-para-phenylene derivatives, poly-para-phenylene vinylene derivatives, polythiophene derivatives, polyacetylene derivatives, polyfluorene derivatives and the like. Specifically preferable examples include, but are not limited to, the following compounds (IX-1) to (IX-17):

In the following formulae (IX-13) to (IX-17), each of Ar and X is a monovalent or divalent group having a structure similar to Ar and X shown in Formulae (II-1) and (II-2); each of n and X is an integer of 1 or more; and y is 0 or 1.

(IX-1)

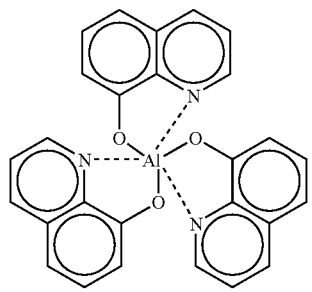

(IX-2)

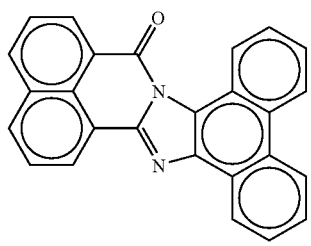

(IX-3)

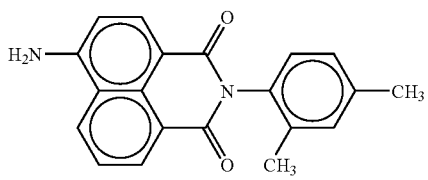

(IX-4)

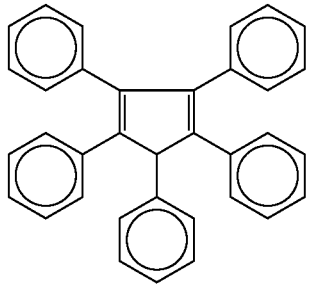

(IX-5)

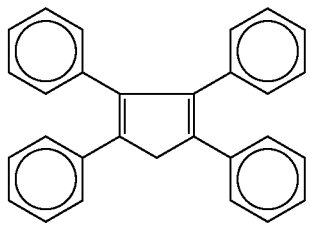

(IX-6)

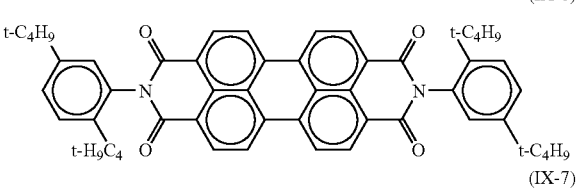

(IX-7)

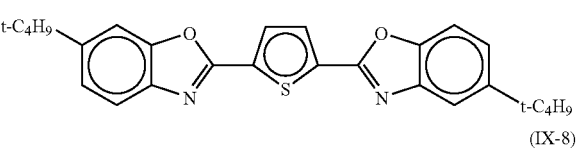

(IX-8)

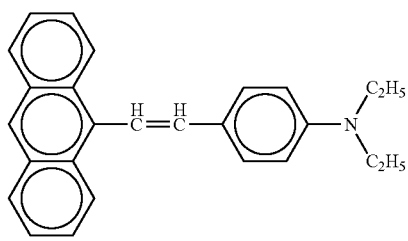

(IX-9)

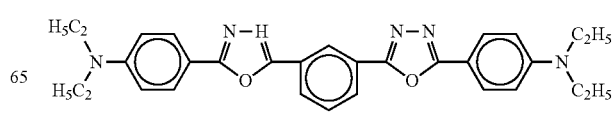

(IX-10)
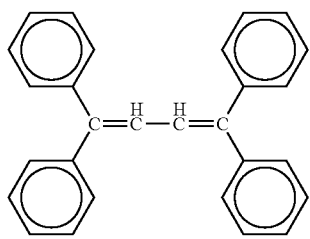

(IX-11)
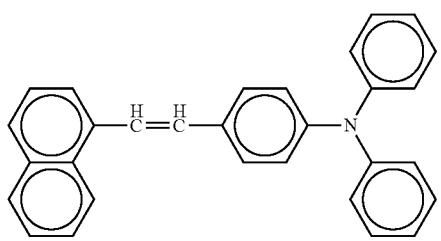

(IX-12)
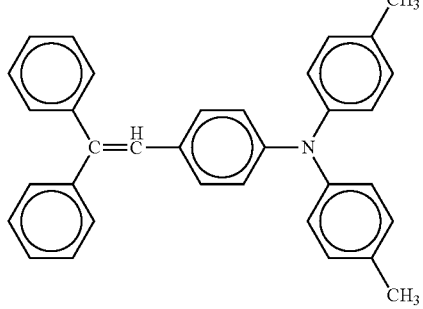

(IX-13)
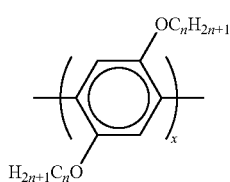

(IX-14)
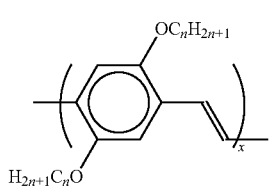

(IX-15)
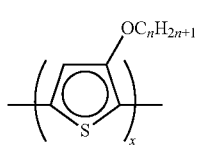

(IX-16)
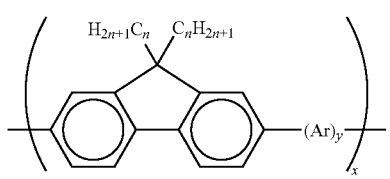

(IX-17)
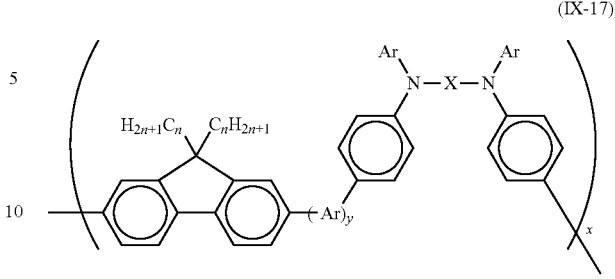

A colorant compound different from the light-emitting material may be doped as a guest material into the light-emitting material, for improvement in durability or luminous efficiency of the organic electroluminescent device. Doping is performed by vapor co-deposition when the light-emitting layer is formed by vacuum deposition, while by mixing to a solution or dispersion when the light-emitting layer is formed by coating/drying of the solution or dispersion. The degree of the colorant compound doping in the light-emitting layer is approximately 0.001 to 40 wt %, preferably approximately 0.01 to 10 wt %.

The colorant compound used in doping is favorably an organic compound favorably compatible with the light-emitting material, giving a favorable thin-film light-emitting layer, and favorable examples thereof include DCM derivatives, quinacridone derivatives, rubrene derivatives, porphyrin-based compounds and the like. Specifically favorable examples thereof include, but are not limited to, the following compounds (X-1) to (X-4):

(X-1)
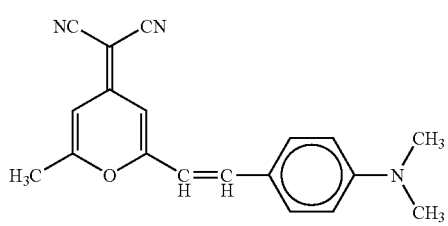

(X-2)
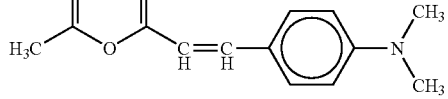

(X-3)
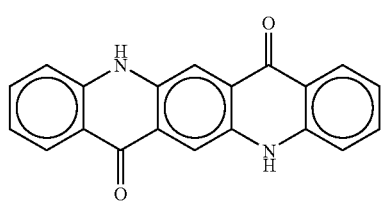

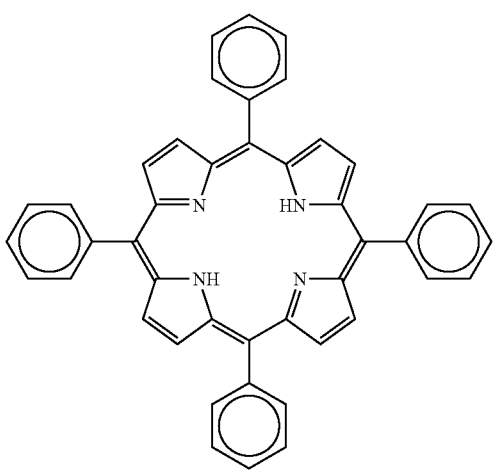

(X-4)

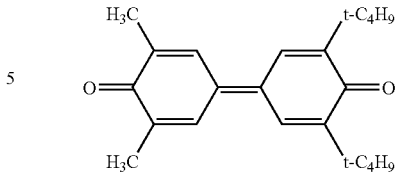

(XI)

The light-emitting layer 5 may be formed only with the light-emitting material; a charge-transporting polyester described above may be added to and dispersed in the light-emitting material in an amount in the range of 1 to 50 wt %, for example for further improvement in electrical properties and light-emitting characteristics; or a charge-transporting material other than the charge-transporting polyester may be added to and dispersed in the light-emitting polymer in an amount in the range of 1 to 50 wt % before preparation of the light-emitting layer.

When the charge-transporting polymer has light-emitting characteristics, it may be used as an emitting material, and in such a case, for example for further improvement in electrical properties and light-emitting characteristics, a charge-transporting material other than the charge-transporting polyester may be added to and dispersed in the light-emitting material in an amount in the range of 1 to 50 wt %.

The light-emitting layer having a charge-transporting capability 7 preferably contains according to applications, for example, a material containing any one of the light-emitting materials above (IX-1) to (IX-17) as its light-emitting material in an amount of 50 wt % or less, as it is dispersed in the charge-transporting polyester with an added function (positive hole- or electron-transporting capability). In such a case, a charge-transporting material other than the charge-transporting polyester may be dispersed in the organic electroluminescent device in an amount of 10 to 50 wt % for control of the balance of positive hole and electron injected.

The charge-transporting material for adjustment of electron transfer efficiency, i.e., electron-transporting material, is favorably an oxadiazole derivative, a nitro-substituted fluorenone derivative, a diphenoquinone derivative, a thiopyranedioxide derivative, a fluorenylidenemethane derivative or the like. Specifically favorable examples include the compounds above (VII-1) to (VII-3). The charge-transporting polyester for use is preferably an organic compound having no strong electronic interaction with the charge-transporting polyester above, and a favorable example thereof includes, but is not limited to, the following compound (XI).

Similarly for adjustment of positive hole mobility, the positive hole-transporting material is favorably a tetraphenylenediamine derivative, a triphenylamine derivative, a carbazole derivative, a stilbene derivative, an aryl hydrazone derivative, a porphyrin-based compound, or the like, and specifically favorable examples thereof include the compounds (VIII-1) to (VIII-7), however tetraphenylenediamine derivatives are preferable, because they are more compatible with the charge-transporting polyester.

A metal element allowing vacuum deposition and having a small work function permitting electron injection is used for the rear-face electrode 8, and particularly favorable examples thereof include magnesium, aluminum, silver, indium, the alloys thereof, metal halogen compounds such as lithium fluoride and lithium oxide, and metal oxides.

A protective layer may be provided additionally on the rear-face electrode 7 for prevention of degradation of the device by water or oxygen. Specific materials for the protective layer include metals such as In, Sn, Pb, Au, Cu, Ag, and Al; metal oxides such as MgO, $SiO_2$, and $TiO_2$; and resins such as polyethylene resin, polyurea resin, and polyimide resin. Vacuum deposition, sputtering, plasma polymerization, CVD, or coating may be used in forming the protective layer.

The organic electroluminescent devices shown in FIGS. 1 to 4 are prepared in the following manner: First, a buffer layer 3 is formed on a transparent electrode 2 previously formed on a transparent insulator substrate 1 by coating a coating solution obtained by dissolving the components in solvent on the transparent electrode 2 by spin coating or dip coating and hardening the resulting film as needed, for example, by heating. Then, a positive hole-transporting layer 4, an emitting layer 5, an electron-transporting layer 6, and an emitting layer having a charge-transporting capability 7 are formed on the buffer layer 3 according to the layer structure of each organic electroluminescent device. Each layer is laminated additionally in a particular order on these layers according to the layer structure of each organic electroluminescent device.

As described above, the light-emitting layer having a positive hole-transporting layer 4, an emitting layer 5, an electron-transporting layer 6 and a charge-transporting capability 7 are formed by vacuum deposition of the material for each layer. Alternatively, the layer is formed for example by spin coating or dip coating, by using a coating solution obtained by dissolving materials for each layer in organic solvent.

When a polymer is used as the charge-transporting material or the light-emitting material, each layer is preferably formed by a casting method of using a coating solution, but may be formed by inkjet method.

The film thickness of the formed buffer layer is preferably in the range of from 1 nm to 200 nm, particularly in the range of from 10 nm to 150 nm.

The thickness of the positive hole-transporting layer 4, the light-emitting layer 5 or the electron-transporting layer 6 is preferably in the range of from 20 nm to 100 nm, particularly in the range of 30 to 80 nm. The thickness of the light-emitting layer having a charge-transporting capability 7 is preferably about 20 nm to 200 nm, more preferably approximately 30 to 200 nm.

Each material (the charge-transporting polyester, light-emitting material, etc.) may be present in the state of molecular dispersion or particular dispersion. In the case of the film-forming method using a coating solution, it is necessary to use a solvent dissolving respective materials to obtain a coating solution in the molecular dispersion state, and the dispersion solvent should be selected properly, considering the dispersibility and solubility of respective materials, to obtain a coating solution in the particular dispersion state. Various means such as ball mill, sand mill, paint shaker, attriter, homogenizer, and ultrasonicator are usable in preparing particular dispersion.

Finally, a rear-face electrode 8 is formed by vacuum deposition on the light-emitting layer 5, the electron-transporting layer 6 or the light-emitting layer having a charge-transporting capability 7, to give an organic electroluminescent device shown in FIG. 1 to 4.

-Display Device-

The display device of the exemplary embodiment has the organic electroluminescent device of the exemplary embodiment and a drive means for driving the organic electroluminescent device.

Specifically as shown in FIGS. 1 to 4, the display device preferably has, for example as the drive means, a voltage-applying device 9 connected to the pair of electrodes of the organic electroluminescent device (transparent electrode 2, rear-face electrode 8) that applies a DC voltage between the pair of electrodes.

For example, in an organic electroluminescent device by using the voltage-applying device 9, the organic electroluminescent device emits light when a DC voltage of 4 to 20 V at a current density of 1 to 200 mA/cm$^2$ is applied between the pair of electrodes.

The minimum unit (one pixel unit) of the organic electroluminescent device of the exemplary embodiment has been described above, however the organic electroluminescent device is also applicable to the display devices having the pixel units (organic electroluminescent devices) arranged in the matrix form. The electrode pairs may also be formed in the matrix form.

Any conventionally known technology, such as simple matrix driving method of using multiple line electrodes and row electrodes and driving the row electrodes collectively according to the image information for each line electrode while the line electrodes or active matrix driving method of using pixel electrodes allocated to respective pixels are scanned, may be used as the method of driving the display device.

EXAMPLES

Hereinafter, the present invention will be described specifically with reference to Examples. However, the invention is not restricted by these Examples.

-Preparation of Charge-transporting Polyester-

Preparative Example 1

2.0 g of the following compound (XIV-1), 8.0 g of ethylene glycol and 0.1 g of tetrabutoxytitanium are placed in a 50-ml flask, and the mixture is stirred under heat at 190° C. under nitrogen stream for 5 hours.

After confirmation of complete consumption of the compound (XIV-1), the mixture is heated to 200° C. and allowed to react for five hours, while ethylene glycol is distilled off under reduced pressure of 0.25 mm Hg. Then, the mixture is cooled to room temperature (e.g., 25° C.) and dissolved in 50 ml of tetrahydrofuran (THF); the insoluble matter is filtered with a 0.2-μm polytetrafluoroethylene (PTFE) filter; and the filtrate is added dropwise into 500 ml of methanol while stirred, reprecipitating the polymer. The polymer obtained is filtered, washed with methanol, and dried, to give 1.9 g of a positive hole-transporting polyester (XIV-2).

The molecular weight distribution of the positive hole-transporting polyester (XIV-2), as determined by gel permeation chromatography (GPC), shows that the weight average molecular weight Mw is $7.24 \times 10^4$ (as styrene) and that the ratio of weight average molecular weight Mw to number-average molecular weight Mn (Mw/Mn) is 1.87.

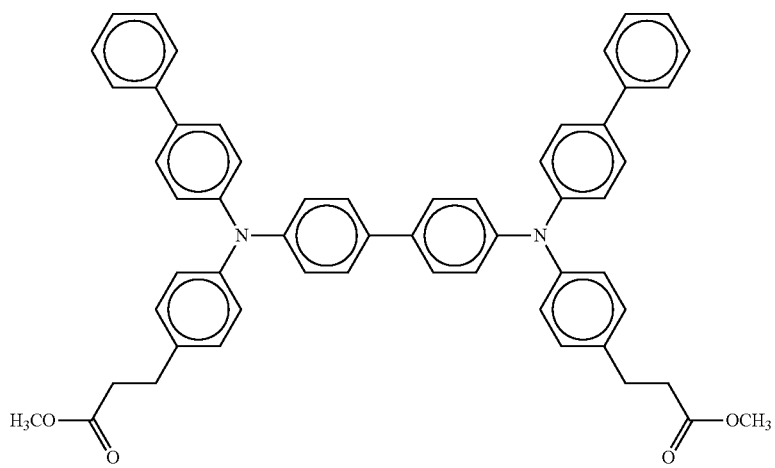

(XIV-1)

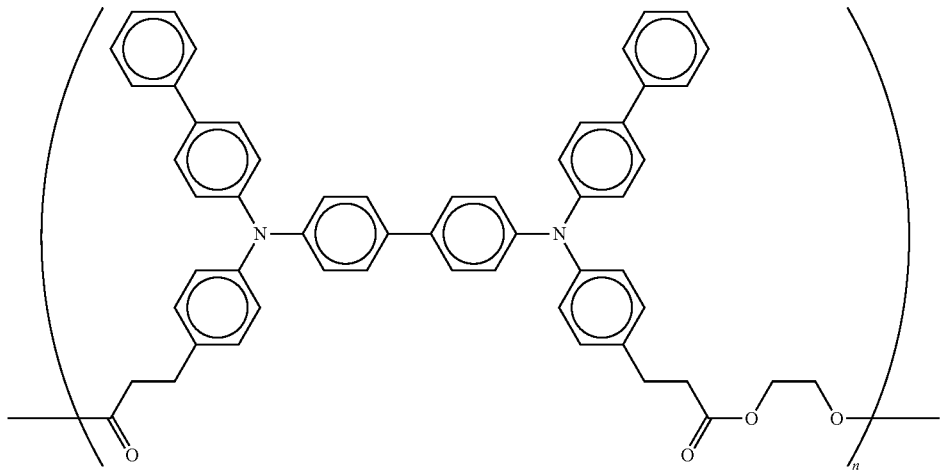

(XIV-2)

Preparative Example 2

2.0 g of the following compound (XV-1), 8.0 g of ethylene glycol and 0.1 g tetrabutoxytitanium are placed in a 50-ml flask, and the mixture is stirred under heat at 190° C. under a nitrogen stream for 5 hours.

After confirmation of complete consumption of the compound (XV-1), the mixture is heated to 200° C. and allowed to react for five hours, while ethylene glycol is distilled off under reduced pressure of 0.25 mm Hg. Then, the mixture is cooled to room temperature (e.g., 25° C.) and dissolved in 50 ml of tetrahydrofuran (THF); the insoluble matter is filtered with a 0.2-μm PTFE filter; and the filtrate is added dropwise into 500 ml of methanol while stirred, reprecipitating the polymer. The polymer obtained is filtered, washed with methanol, and dried, 1.9 g of an electron-transporting polyester (XV-2).

The molecular weight distribution of the electron-transporting polyester (XV-2), as determined by gel permeation chromatography (GPC), shows that Mw is $1.08 \times 10^5$ (as styrene) and Mw/Mn, 2.31.

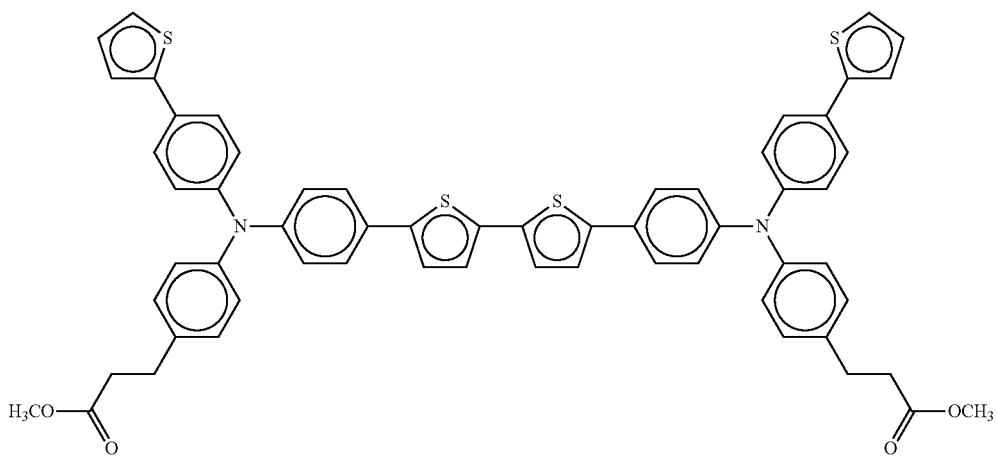

(XV-1)

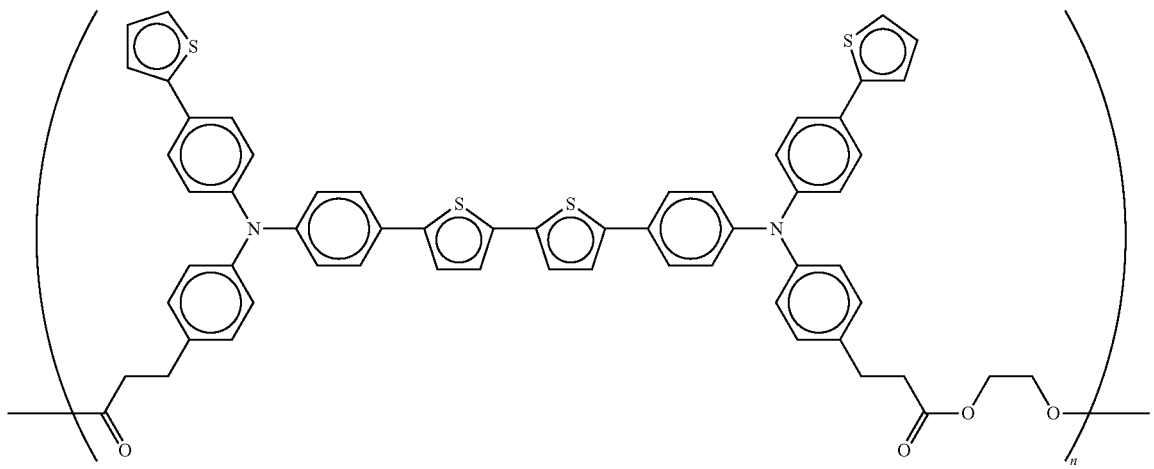

(XV-2)

Preparative Example 3

2.0 g of the following compound (XVI-1), 8.0 g of ethylene glycol and 0.1 g of tetrabutoxytitanium are placed in a 50-ml flask, and the mixture is stirred under heat at 190° C. under nitrogen stream for 5 hours.

After confirmation of complete consumption of the compound (XVI-1), the mixture is heated to 200° C. and allowed to react for five hours, while ethylene glycol is distilled off under reduced pressure of 0.25 mm Hg. Then, the mixture is cooled to room temperature (e.g., 25° C.) and dissolved in 50 ml of tetrahydrofuran (THF); the insoluble matter is filtered with a 0.2-μm PTFE filter; and the filtrate is added dropwise into 500 ml of methanol while stirred, reprecipitating the polymer. The polymer obtained is filtered, washed with methanol, and dried, to give 1.8 g of a positive hole-transporting polyester (XVI-2).

The molecular weight distribution of the positive hole-transporting polyester (XVI-2), as determined by gel permeation chromatography (GPC), shows that Mw is $1.13 \times 10^5$ (as styrene) and Mw/Mn, 2.26.

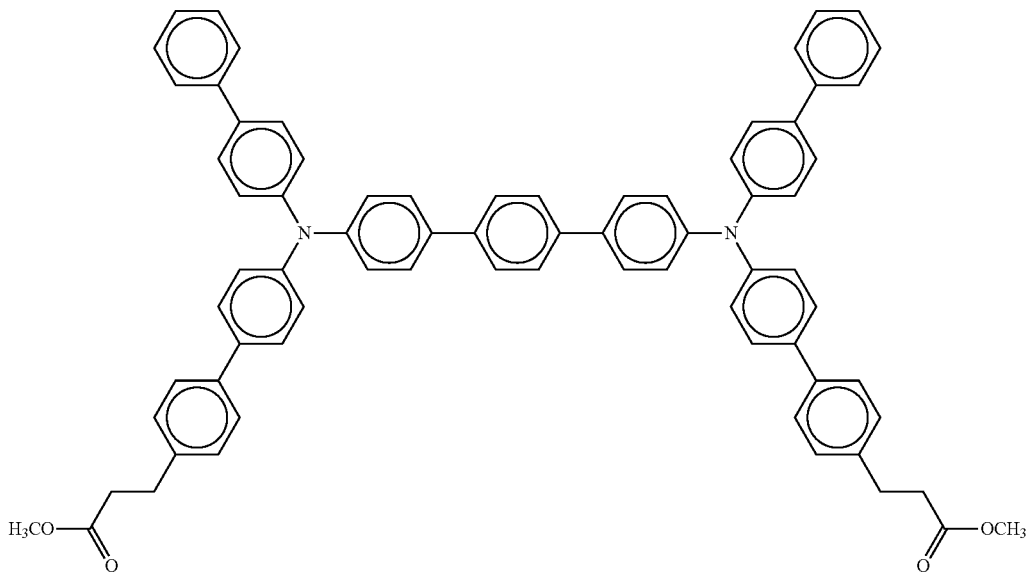

(XVI-1)

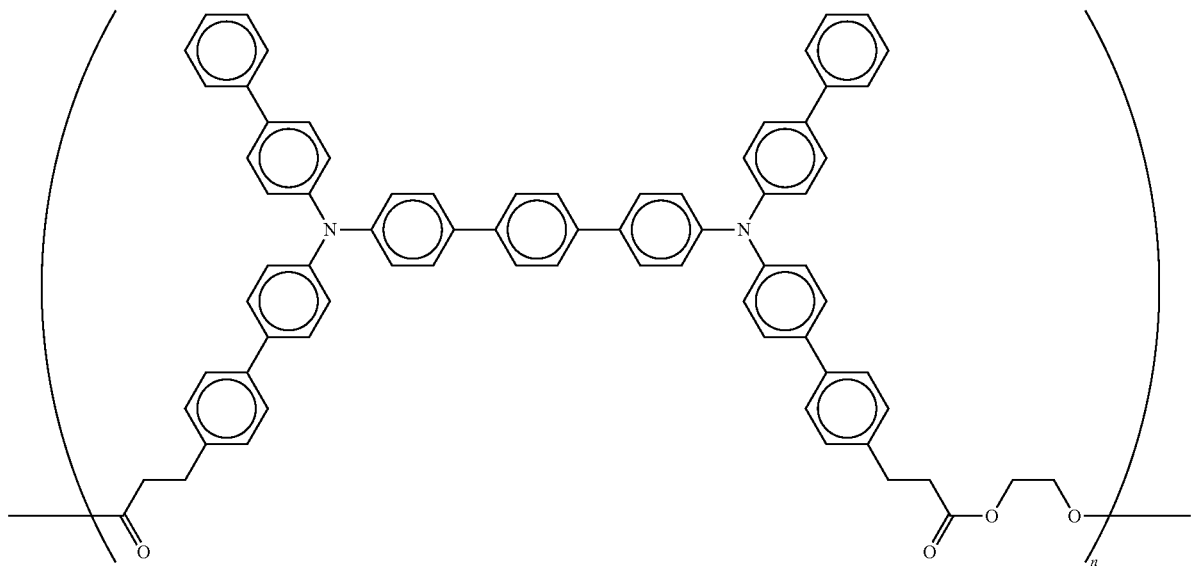

(XVI-2)

Preparative Example 4

2.0 g of the following compound (XVII-1), 8.0 g of ethylene glycol and 0.1 g of tetrabutoxytitanium are placed in a 50-ml flask, and the mixture is stirred under heat at 190° C. under nitrogen stream for 5 hours.

After confirmation of complete consumption of the compound (XVII-1), the mixture is heated to 200° C. and allowed to react for five hours, while ethylene glycol is distilled off under reduced pressure of 0.25 mm Hg. Then, the mixture is cooled to room temperature (e.g., 25° C.) and dissolved in 50 ml of tetrahydrofuran (THF); the insoluble matter is filtered with a 0.2-μm PTFE filter; and the filtrate is added dropwise into 500 ml of methanol while stirred, reprecipitating the polymer. The polymer obtained is filtered, washed with methanol, and dried, to give 1.8 g of a positive hole-transporting polyester (XVI-2).

The molecular weight distribution of the positive hole-transporting polyester (XVII-2), as determined by gel permeation chromatography (GPC), shows that Mw is $1.05 \times 10^5$ (as styrene) and Mw/Mn, 2.1.

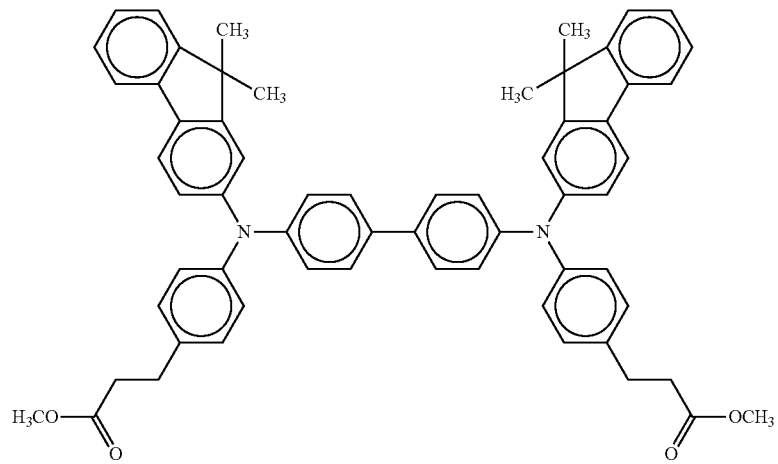

(XVII-1)

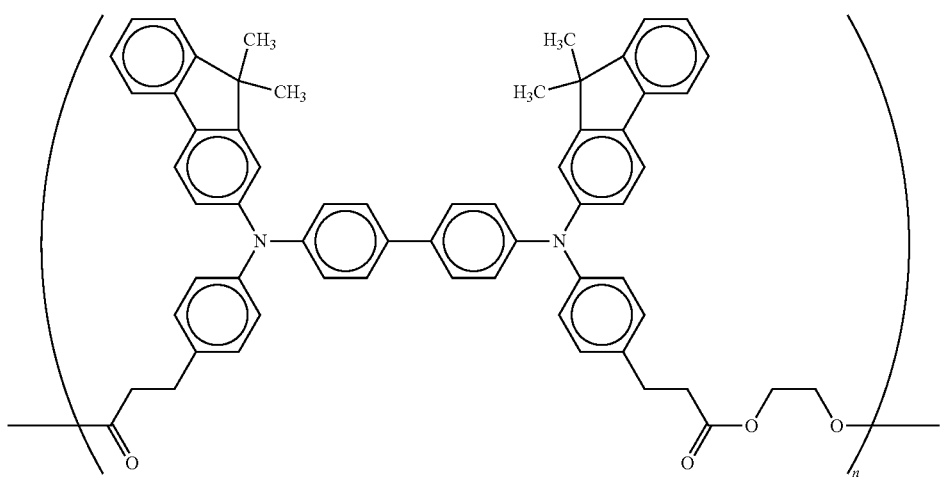
(XVII-2)

Preparative Example 5

2.0 g of the following compound (XVIII-1), 8.0 g of ethylene glycol and 0.1 g of tetrabutoxytitanium are placed in a 50-ml flask, and the mixture is stirred under heat at 190° C. under nitrogen stream for 5 hours.

After confirmation of complete consumption of the compound (XVIII-1), the mixture is heated to 200° C. and allowed to react for five hours, while ethylene glycol is distilled off under reduced pressure of 0.25 mm Hg. Then, the mixture is cooled to room temperature (e.g., 25° C.) and dissolved in 50 ml of tetrahydrofuran (THF); the insoluble matter is filtered with a 0.2-µm PTFE filter; and the filtrate is added dropwise into 500 ml of methanol while stirred, reprecipitating the polymer. The polymer obtained is filtered, washed with methanol, and dried, to give 1.8 g of a positive hole-transporting polyester (XVIII-2).

The molecular weight distribution of the positive hole-transporting polyester (XVIII-2), as determined by gel permeation chromatography (GPC), shows that Mw is $1.13 \times 10^5$ (as styrene) and Mw/Mn, 2.26.

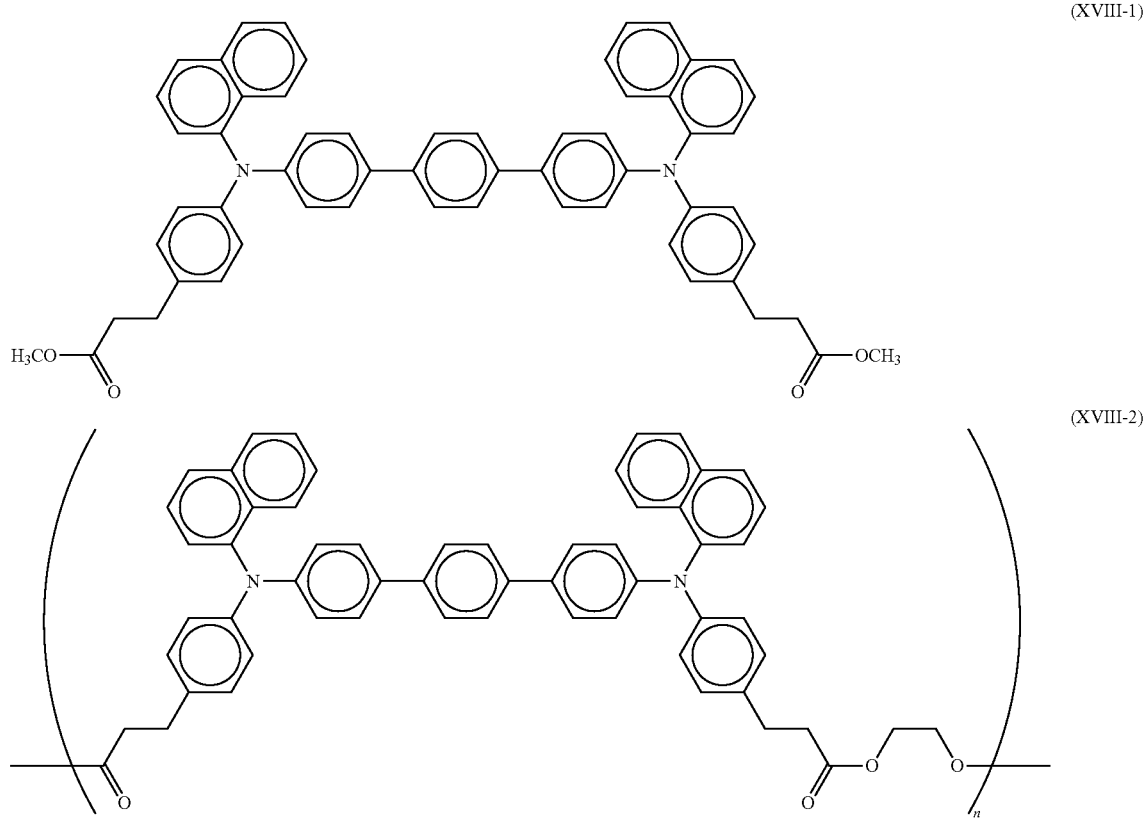

(XVIII-1)

(XVIII-2)

-Preparation of Organic Electroluminescent Device-

Then, an organic electroluminescent device is prepared by using the charge-transporting polyester prepared as described above in the following manner.

Example 1

A solution containing 500 mg of a charge injection material having substituted silicon groups [following formula (XIX), ionization potential: 5.0 eV] and 2 mg of hydrochloric acid (1N) dissolved in 1 ml of butanol 1 ml is prepared as the buffer layer-forming solution.

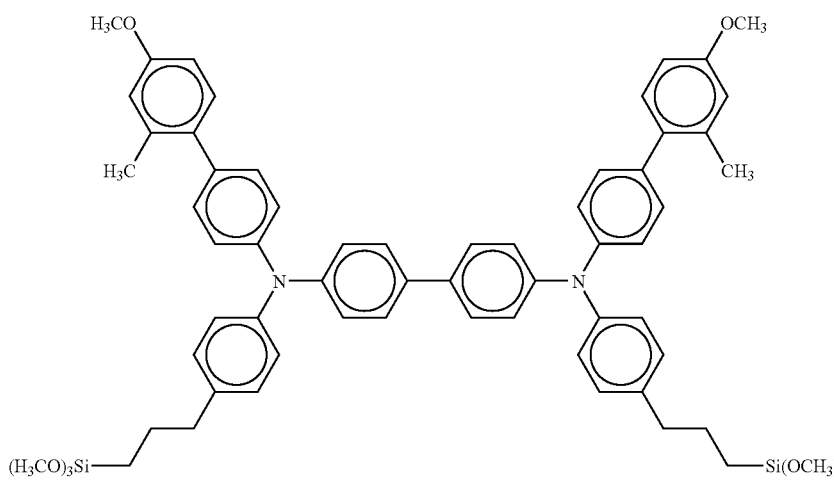

(XIX)

Separately, a substrate having a strip ITO electrode of 2 mm in width (hereinafter, referred to as "ITO electrode-carrying glass plate") is prepared as the transparent electrode-carrying substrate.

Then, the solution above is applied on the ITO electrode-sided surface of the ITO electrode-carrying glass plate dried after cleaning by spin coating and hardened and dried sufficiently by heating at 120° C. for 1 hour, to give a buffer layer having a film thickness of 10 nm.

Then, a chlorobenzene solution containing 5 wt % of an emitting polymer [following compound (XX), polyfluorene-based, Mw≈$10^5$] as the light-emitting material and 1 wt % of a charge-transporting polyester [compound (XIV-2) (Mw: 7.24×$10^4$)] as the positive hole-transporting material, for example for further improvement in electrical properties and light-emitting characteristics, is filtered through a polytetrafluoroethylene (PTFE) filter having an opening of 0.1 μm, and an emitting layer having a film thickness of 30 nm is formed on the buffer layer by spin coating by using the solution thus obtained.

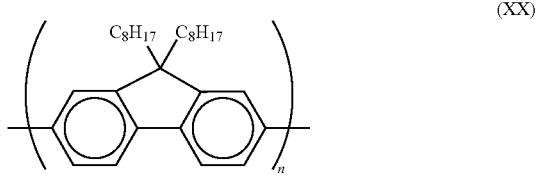

(XX)

After the light-emitting layer formed is dried sufficiently, a dichloroethane solution containing a charge-transporting polyester [compound (XV-2) (Mw: 1.08×$10^5$)] at 5 wt % as the electron-transporting material is filtered through a PTFE filter having an opening of 0.1 μm, and an electron-transporting layer having a film thickness of 30 nm is formed by coating the solution on the light-emitting layer by spin coating.

Finally, a Mg—Ag alloy is deposited thereon by vapor co-deposition, forming a rear-face electrode of 2 mm in width and 150 nm in thickness that crosses the ITO electrode. The effective area of the formed organic EL device is 0.04 $cm^2$.

Example 2

A buffer layer is formed on an ITO electrode-carrying glass plate cleaned similarly to Example 1 by using the charge injection material containing substituted silicon groups represented by Structural Formula (XIX) above [ionization potential: 5.0 eV]; a chlorobenzene solution containing the charge-transporting polyester [compound (XIV-2) (Mw: 7.24×$10^4$)] at 5 wt % as the positive hole-transporting material is filtered though a polytetrafluoroethylene (PTFE) filter having an opening of 0.1 μm, and the solution obtained is coated on the buffer layer by spin coating, to form a positive hole-transporting layer having a film thickness of 30 nm.

After sufficient drying, a chlorobenzene solution containing an emitting polymer [compound (XX), polyfluorene-based, Mw: ca. $10^5$] at 5 wt % as the light-emitting material is filtered through a PTFE filter having an opening of 0.1 μm, and the solution obtained is applied on the positive hole-transporting layer by spin coating, to form an emitting layer having a thickness of 50 nm.

A dichloroethane solution containing a charge-transporting polyester [compound (XV-2) (Mw: 1.08×$10^5$)] at 5 wt % as the electron-transporting material is filtered through a PTFE filter having an opening of 0.1 μm, and the solution obtained is applied on the light-emitting layer by spin coating, to form a electron-transporting layer having a film thickness of 30 nm n.

Finally, a Mg—Ag alloy is deposited thereon by vapor co-deposition, forming a rear-face electrode of 2 mm in width and 150 nm in thickness that crosses the ITO electrode. The effective area of the formed organic EL device is 0.04 $cm^2$.

Example 3

A buffer layer is formed on an ITO electrode-carrying glass plate cleaned similarly to Example 1 by using the charge injection material substituted containing silicon groups represented by Structural Formula (XIX) above [ionization potential: 5.0 eV]; a chlorobenzene solution containing the charge-transporting polyester [compound (XIV-2) (Mw: 7.24×10$^4$)] at 5 wt % as the positive hole-transporting material is filtered though a polytetrafluoroethylene (PTFE) filter having an opening of 0.1 μm, and the solution obtained is coated on the buffer layer by spin coating, to form a positive hole-transporting layer having a film thickness of 30 nm.

After sufficient drying, a chlorobenzene solution containing an emitting polymer [compound (XX), polyfluorene-

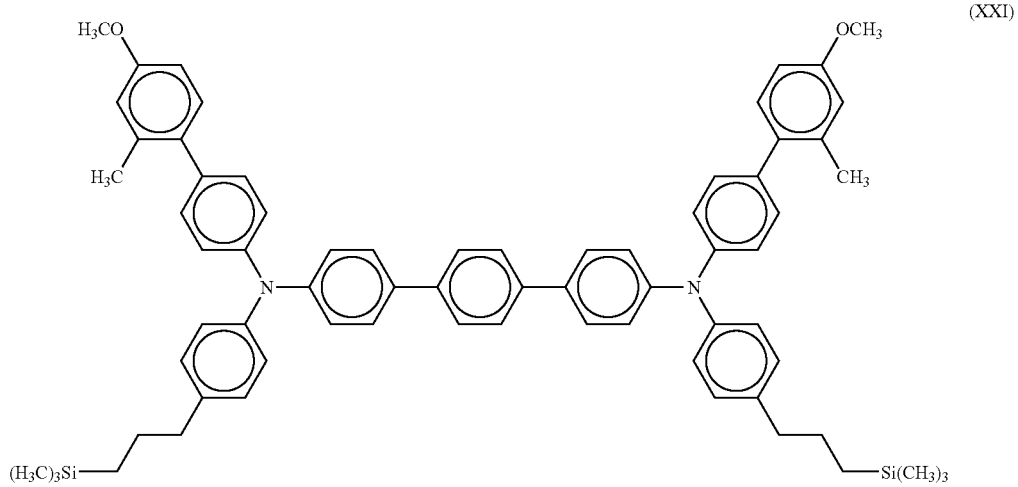

(XXI)

based, Mw: ca. 10$^5$] at 5 wt % as the light-emitting material is filtered through a PTFE filter having an opening of 0.1 μm, and the solution obtained is applied on the positive hole-transporting layer by spin coating, to form an emitting layer having a thickness of 50 nm.

Finally, a Mg—Ag alloy is deposited thereon by vapor co-deposition, forming a rear-face electrode of 2 mm in width and 150 nm in thickness that crosses the ITO electrode. The effective area of the formed organic EL device is 0.04 cm$^2$.

Example 4

A buffer layer is formed on an ITO electrode-carrying glass plate cleaned similarly to Example 1 by using the charge injection material containing substituted silicon groups represented by Structural Formula (XIX) above [ionization potential: 5.0 eV]; 0.5 part by weight of a charge-transporting polyester [compound (XIV-2) (Mw: 7.24×10$^4$)] as the positive hole-transporting material and 0.1 part by weight of an emitting polymer [compound (XX), polyfluorene-based, Mw: ca. 10$^5$] as the light-emitting material are mixed to each other, and a chlorobenzene solution containing the mixture thereof at 10 wt % is filtered through a polytetrafluoroethylene (PTFE) filter having an opening of 0.1 μm, to give a solution for forming light-emitting layer.

The solution is coated on the buffer layer by spin coating, to form charge-transporting light-emitting layer having a film thickness of 50 nm, and finally, a Mg—Ag alloy is deposited thereon by vapor co-deposition, forming a rear-face electrode of 2 mm in width and 150 nm in thickness that crosses the ITO electrode. The effective area of the formed organic EL device is 0.04 cm$^2$.

Example 5

An organic EL device is prepared in a similar manner to Example 1, except that the material represented by the following formula (XXI) [ionization potential: 5.4 eV] is used as the charge injection material containing substituted silicon group for forming the buffer layer, and a solution containing 500 mg of a charge-transporting material and 2 mg of hydrochloric acid (1N) in 1 ml of butanol is coated by spin coating and hardened under heat at 120° C. for 1 hour, to give a buffer layer having a film thickness of 10 nm after sufficient drying.

Example 6

An organic EL device is prepared in a similar manner to Example 2, except that the material represented by the following formula (XXI) [ionization potential: 5.4 eV] is used as the charge injection material containing substituted silicon group for forming the buffer layer, and a solution containing 500 mg of a charge-transporting material and 2 mg of hydrochloric acid (1N) in 1 ml of butanol is coated by spin coating and hardened under heat at 120° C. for 1 hour, to give a buffer layer having a film thickness of 10 nm after sufficient drying.

Example 7

An organic EL device is prepared in a similar manner to Example 3, except that the material represented by the following formula (XXI) [ionization potential: 5.4 eV] is used as the charge injection material containing substituted silicon group for forming the buffer layer, and a solution containing 500 mg of a charge-transporting material and 2 mg of hydrochloric acid (1N) in 1 ml of butanol is coated by spin coating and hardened under heat at 120° C. for 1 hour, to give a buffer layer having a film thickness of 10 nm after sufficient drying.

Example 8

An organic EL device is prepared in a similar manner to Example 4, except that a material represented by Structural Formula (XXI) [ionization potential: 5.4 eV] is used as the hydrolytic group-containing charge injection material containing substituted silicon group for forming the buffer layer, and a solution containing 500 mg of a charge-transporting material and 2 mg of hydrochloric acid (1N) in 1 ml of butanol is coated by spin coating and hardened under heat at 120° C. for 1 hour, to give a buffer layer having a film thickness of 10 nm after sufficient drying.

Example 9

An organic EL device is prepared in a similar manner to Example 1, except that a chlorobenzene solution containing an emitting polymer [following compound (XXII), poly-para-phenylene vinylene (PPV)-based, Mw: ca. 105] at 5 wt % as the light-emitting material is filtered through a polytetrafluoroethylene (PTFE) filter having an opening of 0.1 μm, and the solution obtained is applied on the buffer layer by spin coating, to form an emitting layer having a film thickness of 30 nm.

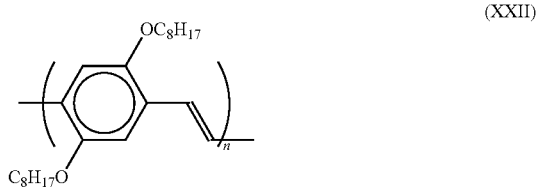
(XXII)

Example 10

An organic EL device is prepared in a similar manner to Example 2, except that a chlorobenzene solution containing a light-emitting polymer [compound (XXII), PPV-based, Mw: ca. 105] at 5 wt % as the light-emitting material is filtered through a polytetrafluoroethylene (PTFE) filter having an opening of 0.1 μm and the solution obtained is coated on the positive hole-transporting layer by spin coating, to form an emitting layer having a film thickness of 30 nm.

Example 11

An organic EL device is prepared in a similar manner to Example 3, except that a chlorobenzene solution containing a light-emitting polymer [compound (XXII), PPV-based, Mw: ca. 105] at 5 wt % as the light-emitting material is filtered through a polytetrafluoroethylene (PTFE) filter having an opening of 0.1 μm and the solution obtained is applied on the positive hole-transporting layer by spin coating, to form an emitting layer having a film thickness of 30 nm.

Example 12

0.5 part by weight of a charge-transporting polyester [compound (XIV-2) (Mw: 7.24×10$^4$)] as the positive hole-transporting material and 0.4 part by weight of a light-emitting polymer (XXII), PPV-based, Mw: ca. 10$^5$] as the light-emitting material are mixed to each other, and a chlorobenzene solution containing the mixture at 10 wt % is filtered through a polytetrafluoroethylene (PTFE) filter having an opening of 0.1 μm, to give a solution for forming an emitting layer.

An organic EL device is prepared in a similar manner to Example 4, except that the solution is applied on the buffer layer by spin coating, to form a charge-transporting light-emitting layer having film thickness of 50 nm.

Example 13

An organic EL device is prepared in a similar manner to Example 11, except that a material represented by the Structural Formula (XXI) [ionization potential: 5.4 eV] is used as the charge-transporting material containing substituted silicon group for forming the buffer layer and a solution containing 500 mg of a charge-transporting material and 2 mg of hydrochloric acid (IN) in 1 ml of butanol is coated by spin coating and hardened under heat at 120° C. for 1 hour, to give a buffer layer having a film thickness of 10 nm after sufficient drying.

Example 14

An organic EL device is prepared in a similar manner to Example 11, except that a chlorobenzene solution containing the charge-transporting polyester [compound (XVI-2) (Mw: 1.13×10$^5$)] at 5 wt % as the positive hole-transporting material is filtered through a polytetrafluoroethylene (PTFE) filter having an opening of 0.1 μm and the solution obtained is applied on the buffer layer by spin coating to form a positive hole-transporting layer having a film thickness of 30 nm.

Example 15

A buffer layer of the charge-transporting material containing substituted silicon groups represented by Structural Formula (XIX) [ionization potential: 5.0 eV] is formed on an ITO electrode-carrying glass plate cleaned similarly to Example 1; a chlorobenzene solution containing the charge-transporting polyester [compound (XIV-2) (Mw: 7.24×10$^4$)] at 5 wt % as the positive hole-transporting material is filtered through a polytetrafluoroethylene (PTFE) filter having an opening of 0.1 μm; and the solution obtained is applied on the buffer layer by spin coating, to form a positive hole-transporting layer having a film thickness of 30 nm.

After sufficient drying, sublimation-purified Alq$_3$ (compound (IX-1)) is placed on a tungsten board as the light-emitting material, and an emitting layer having a film thickness of 50 nm is formed on the positive hole-transporting layer by vacuum deposition. The degree of vacuum then is 10$^{-5}$ Torr, and the board temperature is 300° C.

Finally, a Mg—Ag alloy is deposited thereon by vapor co-deposition, forming a rear-face electrode of 2 mm in width and 150 nm in thickness that crosses the ITO electrode. The effective area of the formed organic EL device is 0.04 cm$^2$.

Example 16

An organic EL device is prepared in a similar manner to Example 14, except that a material represented by the Structural Formula (XXI) above [ionization potential: 5.4 eV] is used as the charge-transporting material containing substituted silicon group for forming the buffer layer and a solution containing 500 mg of a charge-transporting material and 2 mg of hydrochloric acid (IN) in 1 ml of butanol is coated by spin coating and hardened under heat at 120° C. for 1 hour, to give a buffer layer having a film thickness of 10 nm after sufficient drying.

Example 17

An organic EL device is prepared in a similar manner to Example 11, except that a chlorobenzene solution containing the charge-transporting polyester [compound (XVII-2) (Mw: 1.05×10$^5$)] at 5 wt % as the positive hole-transporting material is filtered through a polytetrafluoroethylene (PTFE) filter having an opening of 0.1 μm and the solution obtained is applied on the buffer layer by spin coating, to form a positive hole-transporting layer having a film thickness of 30 nm.

Example 18

An organic EL device is prepared in a similar manner to Example 11, except that a chlorobenzene solution containing the charge-transporting polyester [compound (XVIII-2) (Mw: $1.13\times10^5$)] at 5 wt % as the positive hole-transporting material is filtered through a polytetrafluoroethylene (PTFE) filter having an opening of 0.1 μm and the solution obtained is applied on the buffer layer by spin coating, to form a positive hole-transporting layer having a film thickness of 30 nm.

Example 19

An organic EL device is prepared in a similar manner to Example 1, except that a material represented by following formula (XXIII) above [ionization potential: 5.1 eV] is used as the charge injection material containing substituted silicon group for forming the buffer layer and a solution containing 500 mg of a charge-transporting material and 2 mg of hydrochloric acid (1N) in 1 ml of butanol is coated by spin coating and hardened under heat at 120° C. for 1 hour, to form a buffer layer having a film thickness of 10 nm after sufficient drying.

formed directly on the ITO electrode-sided surface of an ITO electrode-carrying glass plate without forming a buffer layer with the charge-transporting material containing substituted silicon group.

Comparative Example 4

An organic EL device is prepared in a similar manner to Example 4, except that an emitting layer is formed directly on the ITO electrode-sided surface of an ITO electrode-carrying glass plate without forming a buffer layer with the charge-transporting material containing substituted silicon group.

Comparative Example 5

An organic EL device is prepared in a similar manner to Example 11, except that a positive hole-transporting layer is formed directly on the ITO electrode-sided surface of an ITO electrode-carrying glass plate without forming a buffer layer with the charge-transporting material containing substituted silicon group.

Comparative Example 6

An organic EL device is prepared in a similar manner to Example 3, except that Baytron P (PEDOT-PSS, manufactured by Bayer: mixed aqueous dispersion containing poly-

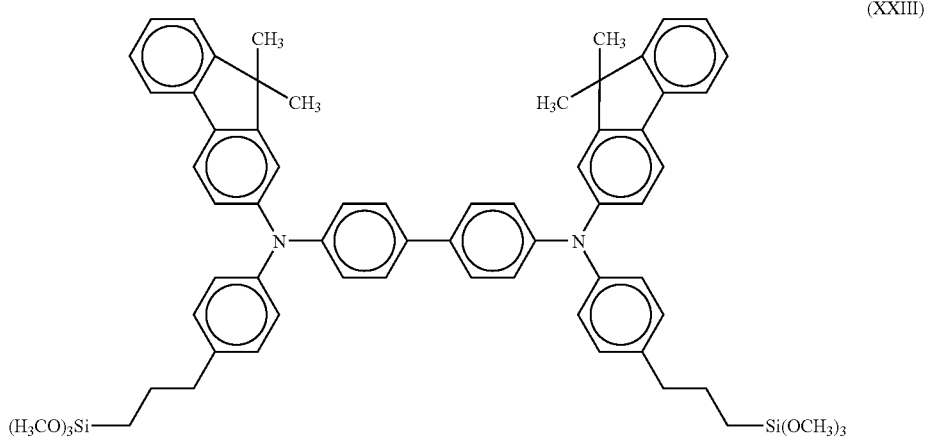

(XXIII)

Comparative Example 1

An organic EL device is prepared in a similar manner to Example 1, except that an emitting layer is formed directly on the ITO electrode-sided surface of an ITO electrode-carrying glass plate without forming a buffer layer with the charge-transporting material containing substituted silicon groups.

Comparative Example 2

An organic EL device is prepared in a similar manner to Example 2, except that a positive hole-transporting layer is formed directly on the ITO electrode-sided surface of an ITO electrode-carrying glass plate without forming a buffer layer with the charge-transporting material containing substituted silicon group.

Comparative Example 3

An organic EL device is prepared in a similar manner to Example 3, except that a positive hole-transporting layer is ethylenedioxide thiophene [following compound (XXIV), ionization potential: 5.1 to 5.2 eV] and polystyrenesulfonic acid) is used as the charge injection material for forming the buffer layer and the solution is applied on the ITO electrode-sided surface of an ITO electrode-carrying glass plate previously dried after cleaning by spin coating and hardened under heat at 200° C. for 10 minutes, to form a buffer layer having a film thickness of 10 nm after sufficient drying.

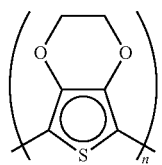

(XXIV)

Comparative Example 7

An organic EL device is prepared in a similar manner to Example 11, except that Baytron (Baytron)P (PEDOT-PSS, manufactured by Bayer: mixed aqueous solution containing polyethylenedioxide thiophene [the compound (XXIV), ionization potential: 5.1 to 5.2 eV] and polystyrenesulfonic acid) is used as the charge injection material for forming the buffer layer and the solution is applied on the ITO electrode-sided surface of an ITO electrode-carrying glass plate previously dried after cleaning by spin coating and hardened under heat at 200° C. for 10 minutes, to form a buffer layer having a film thickness of 10 nm after sufficient drying.

Comparative Example 8

An organic EL device is prepared in a similar manner to Example 3, except that a chlorobenzene solution containing a low-molecular-weight injection material star-burst compound [compound (VIII-5), MTDATA (4,4',4"-tris(3-methylphenylphenylamino)propyltriphenylamine), ionization potential: 5.1 eV] at 5 wt % as the charge injection material for forming the buffer layer is filtered through a PTFE filter having an opening of 0.1 μm and the solution obtained is applied on the ITO electrode-sided surface of an ITO electrode-carrying glass plate previously dried after cleaning by spin coating, to form a buffer layer having a film thickness of 10 nm after sufficient drying.

Comparative Example 9

An organic EL device is prepared in a similar manner to Example 11, except that a chlorobenzene solution containing a low-molecular-weight injection material star-burst compound [compound (VIII-5), MTDATA, ionization potential: 5.1 eV] at 5 wt % as the charge injection material for forming the buffer layer is filtered through a PTFE filter having an opening of 0.1 μm, and the solution obtained is applied on the ITO electrode-sided surface of an ITO electrode-carrying glass plate previously dried after cleaning by spin coating, to form a buffer layer having a film thickness of 10 nm after sufficient drying.

Comparative Example 10

An organic EL device is prepared in a similar manner to Example 3, except that a vinyl skeleton-containing charge-transporting polymer [following compound (XXV), Mw: $5.46 \times 10^4$ (as styrene)] is used as the positive hole-transporting material in place of the charge-transporting polyester [compound (XIV-2)].

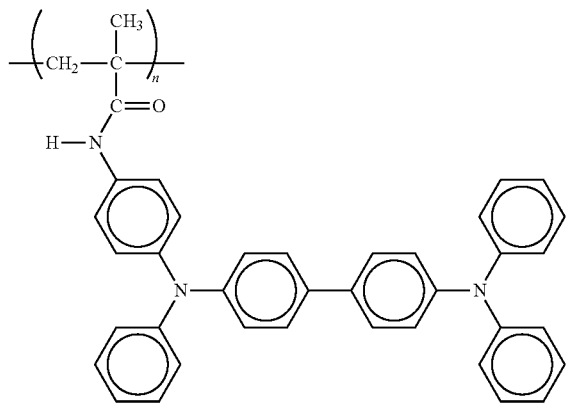

(XXV)

Comparative Example 11

An organic EL device is prepared in a similar manner to Example 3, except that a polycarbonate skeleton-containing charge-transporting polymer [following compound (XXVI), Mw: $7.83 \times 10^4$ (as styrene)] is used as the positive hole-transporting material in place of the charge-transporting polyester [compound (XIV-2)].

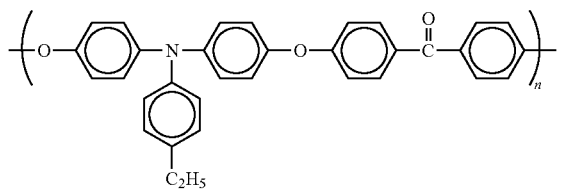

(XXVI)

Comparative Example 12

An organic EL device is prepared in a similar manner to Example 11, except that a vinyl skeleton-containing charge-transporting polymer [the compound (XXV), Mw: $5.46 \times 10^4$ (as styrene)] is used as the positive hole-transporting material in place of the charge-transporting polyester [compound (XIV-2)].

Comparative Example 13

An organic EL device is prepared in a similar manner to Example 11 except that a polycarbonate skeleton-containing charge-transporting polymer [compound (XXVI), Mw: $7.83 \times 10^4$ (as styrene)] is used as the positive hole-transporting material in place of the charge-transporting polyester [compound (XIV-2)].

-Evaluation-

The start-up voltage (driving voltage), the maximum brightness, and the drive current density at the maximum brightness when DC voltage is applied between the ITO electrode (plus), and the Mg—Ag rear-face electrode (minus) of each of the organic EL devices thus prepared under vacuum ($133.3 \times 10^{-3}$ Pa ($10^{-5}$ Torr)) for light emission are evaluated. The results are summarized in Table 3.

Separately, the emission lifetime of each organic EL device is determined under dry nitrogen. The emission lifetime is determined at a current giving an initial brightness of 50 cd/m$^2$, and the device lifetime (hour) is the period until the brightness decreases to half of the initial value under constant-current drive. The device lifetime then is also shown in Table 3.

TABLE 3

|  | Setup voltage (cd/m$^2$) | Maximum brightness (cd/m$^2$) | Drive current density (mA/cm$^2$) | Device lifetime (hour) |
| --- | --- | --- | --- | --- |
| Example 1 | 3.1 | 8630 | 320 | 49 |
| Example 2 | 2.5 | 10300 | 255 | 59 |
| Example 3 | 2.3 | 11000 | 310 | 60 |
| Example 4 | 2.9 | 5600 | 330 | 44 |
| Example 5 | 3.6 | 8700 | 295 | 47 |
| Example 6 | 2.6 | 12200 | 330 | 65 |
| Example 7 | 2.6 | 10500 | 280 | 68 |
| Example 8 | 3.6 | 6400 | 290 | 39 |
| Example 9 | 2.7 | 10500 | 300 | 45 |

TABLE 3-continued

| | Setup voltage (cd/m²) | Maximum brightness (cd/m²) | Drive current density (mA/cm²) | Device lifetime (hour) |
|---|---|---|---|---|
| Example 10 | 2.0 | 13400 | 345 | 60 |
| Example 11 | 1.9 | 11500 | 305 | 57 |
| Example 12 | 3.5 | 6400 | 380 | 43 |
| Example 13 | 2.0 | 11400 | 290 | 68 |
| Example 14 | 2.3 | 12200 | 310 | 70 |
| Example 15 | 1.9 | 10500 | 300 | 48 |
| Example 16 | 2.0 | 9400 | 320 | 50 |
| Example 17 | 2.2 | 11900 | 285 | 63 |
| Example 18 | 2.3 | 10200 | 310 | 62 |
| Example 19 | 2.1 | 9630 | 300 | 59 |
| Comparative Example 1 | 6.5 | 5900 | 180 | 29 |
| Comparative Example 2 | 6.1 | 4200 | 140 | 21 |
| Comparative Example 3 | 5.7 | 3630 | 170 | 15 |
| Comparative Example 4 | 7.5 | 4000 | 150 | 19 |
| Comparative Example 5 | 6.8 | 5600 | 80 | 25 |
| Comparative Example 6 | 2.3 | 9020 | 310 | 39 |
| Comparative Example 7 | 2.4 | 10200 | 300 | 40 |
| Comparative Example 8 | 2.8 | 7700 | 290 | 25 |
| Comparative Example 9 | 2.9 | 8400 | 315 | 23 |
| Comparative Example 10 | 2.8 | 4700 | 300 | 38 |
| Comparative Example 11 | 2.9 | 4400 | 255 | 25 |
| Comparative Example 12 | 2.5 | 6000 | 300 | 20 |
| Comparative Example 13 | 2.9 | 5400 | 270 | 24 |

As apparent from Table 3, the organic EL devices shown in Examples 1 to 19, which are made of materials of which the charge injection material has a substituted hydrolytic group-containing silicon group, give, after hardening, a buffer layer resistant to bleeding to the neighboring layers, superior in adhesiveness to the anode (ITO electrode), and improved in charge-injecting efficiency and charge balance, which is also superior in charge injecting efficiency, and thus, are more reliable, higher in brightness and performance than the organic EL devices of Comparative Examples 1 to 5 having no buffer layer.

As apparent from comparison between the organic EL devices of Examples 3 and 11 with those of Comparative Examples 6 and 7, even when a buffer layer possibly containing a low-molecular weight component causing bleeding is used, the organic EL devices of Examples 3 and 11 containing the charge injection material in the exemplary embodiment in the buffer layer are superior in device lifetime.

In addition, as apparent from comparison of the organic EL devices of Example 3 and 11 with those of Comparative Examples 9 to 11, the organic EL devices of Examples 3 and 11 using the charge-transporting polyester in the exemplary embodiment are more superior in device lifetime and luminescence brightness. Apparently, it is because the adhesiveness to the buffer layer and the charge-transporting efficiency are improved by using the charge-transporting polyester of the exemplary embodiment.

In addition, there is no pinhole or separation defect during film formation in any Example. Because it is possible to form a favorable thin film for example by spin coating or dip coating, it is possible to increase the device area easily without defects such as pinhole and to give an organic EL device superior in durability and light-emitting characteristics.

The foregoing description of the embodiments of the present invention has been provided for the purposes of illustration and description. It is not intended to be exhaustive or to limit the invention to the precise forms disclosed. Obviously, many modifications and variations will be apps rent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic electroluminescent device comprising an anode and a cathode, at least one of which is transparent or translucent, and an organic compound layer disposed between the anode and the cathode, the organic compound layer having two or more layers including at least a buffer layer and an emitting layer, at least one of the organic compound layers other than the buffer layer containing at least one charge-transporting polyester represented by the following Formula (I-1) or (I-2);

the buffer layer being provided in contact with the anode and containing a crosslinked compound formed by using at least one charge injection material containing a substituted silicon group represented by the following Formula (III); and the charge injection material being at least one aromatic amine compound represented by any one of the following Formulae (IV-1) to (IV-4):

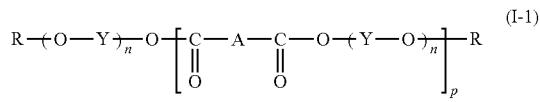

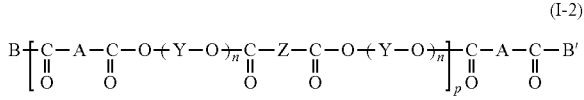

in Formulae (I-1) and (I-2), A representing at least one structure selected from the structures represented by the following Formulae (II-1) and (II-2); R representing a hydrogen atom, an alkyl group, a substituted or unsubstituted aryl group, or a substituted or unsubstituted aralkyl group; Y representing a dihydric alcohol residue; Z representing a divalent carboxylic acid residue; B and B' each independently representing a group —O—(Y—O)$_n$—R or a group —O—(Y—O)$_n$—CO-Z—CO—O—R', when, R, Y, and Z are the same as those described above; R' represents an alkyl group, a substituted or unsubstituted aryl group, or a substituted or unsubstituted aralkyl group; and n is an integer of 1 to 5; n being an integer of 1 to 5; and p being an integer of 5 to 5,000,

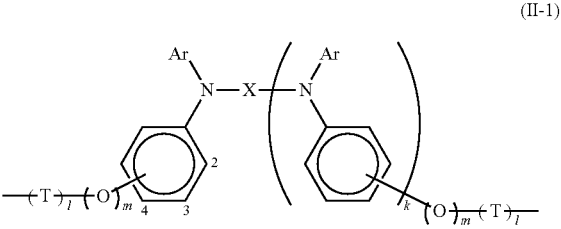

(II-2)

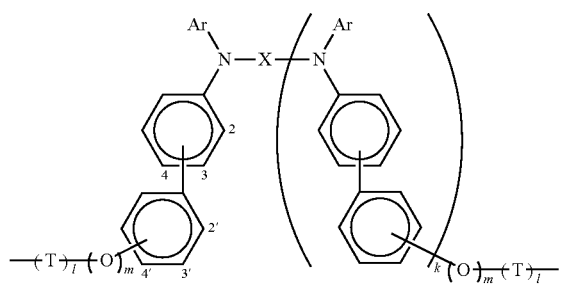

in Formulae (II-1) and (II-2), Ar representing a substituted or unsubstituted monovalent aromatic group; X representing a substituted or unsubstituted divalent aromatic group; k, m, and l each being 0 or 1; T representing a divalent straight-chain hydrocarbon having 1 to 6 carbon atoms or a branched hydrocarbon having 2 to 10 carbon atoms, $$-Si(R_1)_{3-a}Q_a \quad (III)$$

in Formula (III), $R_1$ representing a hydrogen atom, an alkyl group, or a substituted or unsubstituted aryl group; Q representing a hydrolytic group; and a being an integer of 1 to 3, and (IV-1)

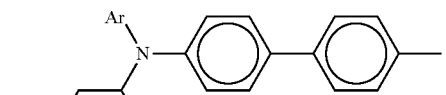

(IV-2)

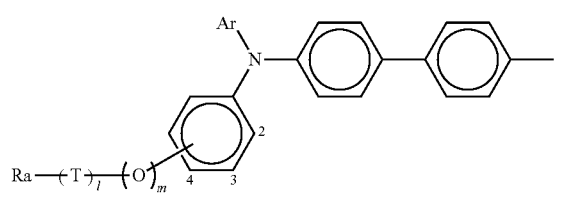

(IV-3)

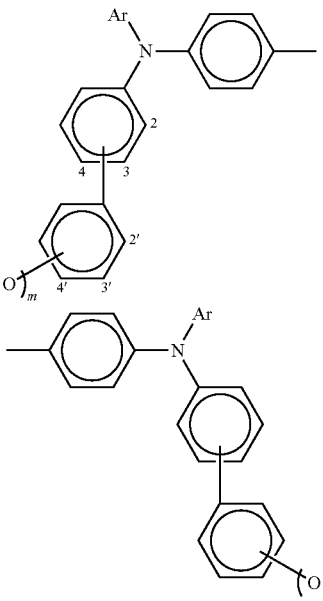

(IV-4)

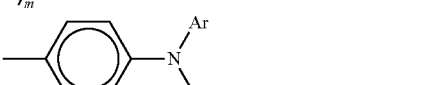

in Formulae (IV-1) to (IV-4), Ar represents a substituted or unsubstituted monovalent polynuclear aromatic hydrocarbon having 2 to 10 aromatic rings, a substituted or unsubstituted monovalent aromatic heterocyclic ring, or a substituted or unsubstituted monovalent aromatic group containing at least one aromatic heterocyclic ring;

Ra represents at least one substituted silicon group represented by the Formula (III); m and l are 0 or 1; and T represents a divalent straight-chain hydrocarbon having 1 to 6 carbon atoms or a branched hydrocarbon having 2 to 10 carbon atoms.

2. The organic electroluminescent device of claim 1, wherein the organic compound layer has at least a buffer layer, an emitting layer, and an electron-transporting layer laminated in this order from the anode side, and at least one of the light-emitting layer and the electron-transporting layer contains at least one charge-transporting polyester represented by the Formula (I-1) or (I-2).

3. The organic electroluminescent device of claim 2, wherein the light-emitting layer contains a charge-transporting material other than the at least one charge-transporting polyester.

4. The organic electroluminescent device of claim 1, wherein the organic compound layer has at least a buffer layer, a positive hole-transporting layer, an emitting layer, and an electron-transporting layer laminated in this order from the anode side, and at least one of the positive hole-transporting layer, the light-emitting layer and the electron-transporting layer contains at least one charge-transporting polyester represented by the Formula (I-1) or (I-2).

5. The organic electroluminescent device of claim 4, wherein the light-emitting layer contains a charge-transporting material other than the at least one charge-transporting polyester.

6. The organic electroluminescent device of claim 1, wherein the organic compound layer has at least a buffer layer, a positive hole-transporting layer, and an emitting layer laminated in this order from the anode side, and
at least one of the positive hole-transporting layer and the light-emitting layer contains at least one charge-transporting polyester represented by the Formula (I-1) or (I-2).

7. The organic electroluminescent device of claim 6, wherein the light-emitting layer contains a charge-transporting material other than the at least one charge-transporting polyester.

8. The organic electroluminescent device of claim 1, wherein the organic compound layer has at least a buffer layer and an emitting layer having a charge-transporting property laminated in this order from the anode side and
the light-emitting layer having a charge-transporting property contains at least one charge-transporting polyester represented by the Formula (I-1) or (I-2).

9. The organic electroluminescent device of claim 8, wherein the light-emitting layer having a charge-transporting property contains a charge-transporting material other than the at least one charge-transporting polyester.

10. The organic electroluminescent device of claim 1, wherein the charge-transporting polyester is a positive hole-transporting material.

11. The organic electroluminescent device of claim 1, wherein the weight-average molecular weight of the at least one charge-transporting polyester is in the range of from 5,000 to 1,000,000.

12. The organic electroluminescent device of claim 1, wherein the film thickness of the organic compound layer closest to the anode among the organic compound layers containing the charge-transporting polyester is in the range of from 20 nm to 100 nm.

13. The organic electroluminescent device of claim 1, wherein the film thickness of the buffer layer is from 1 nm to 200 nm.

14. A display device having:
a substrate, and
an organic electroluminescent device disposed on the substrate in a matrix form,
the organic electroluminescent device comprising an anode and a cathode, at least one of which is transparent or translucent and an organic compound layer disposed between the anode and the cathode,
the organic compound layer having two or more layers including at least a buffer layer and an emitting layer;

at least one of the organic compound layers other than the buffer layer containing at least one charge-transporting polyester represented by the following Formula (I-1) or (I-2);
the buffer layer being provided in contact with the anode and containing a crosslinked compound formed by using at least one charge injection material containing a substituted silicon group represented by the following Formula (III); and
the charge injection material being at least one aromatic amine compound represented by any one of the following Formulae (IV-1) to (IV-4):

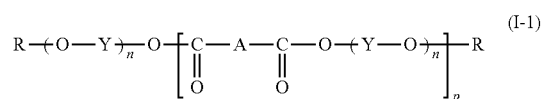

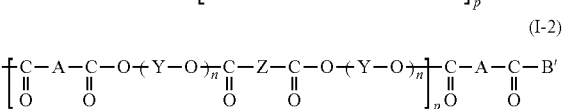

in Formulae (I-1) and (I-2), A representing at least one structure selected from the structures represented by the following Formulae (II-1) and (II-2); R representing a hydrogen atom, an alkyl group, a substituted or unsubstituted aryl group, or a substituted or unsubstituted aralkyl group; Y representing a dihydric alcohol residue; Z representing a divalent carboxylic acid residue; B and B' each independently representing a group —O—(Y—O)$_n$—R or a group —O—(Y—O)$_n$—CO—Z—CO—O—R' when R, Y, and Z are the same as those described above; R' represents an alkyl group, a substituted or unsubstituted aryl group, or a substituted or unsubstituted aralkyl group; and n is an integer of 1 to 5; n being an integer of 1 to 5; and p being an integer of 5 to 5,000,

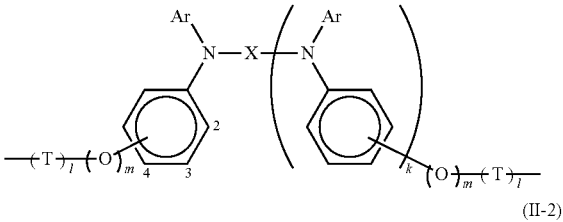

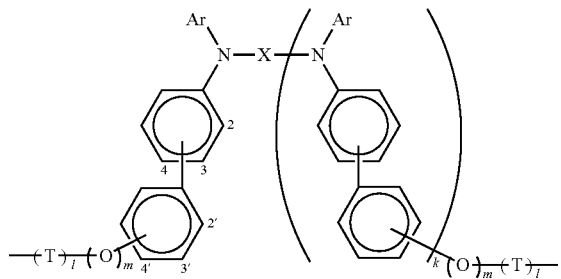

in Formulae (II-1) and (II-2), Ar representing a substituted or unsubstituted monovalent aromatic group; X representing a substituted or unsubstituted divalent aromatic group; k, m, and l each being 0 or 1; and T representing a divalent straight-chain hydrocarbon having 1 to 6 carbon atoms or a branched hydrocarbon having 2 to 10 carbon atoms, $$—Si(R_1)_{3-a}Q_a \quad (III)$$

in Formula (III), $R_1$ representing a hydrogen atom, an alkyl group, or a substituted or unsubstituted aryl group; Q representing a hydrolytic group; and a being an integer of 1 to 3, and

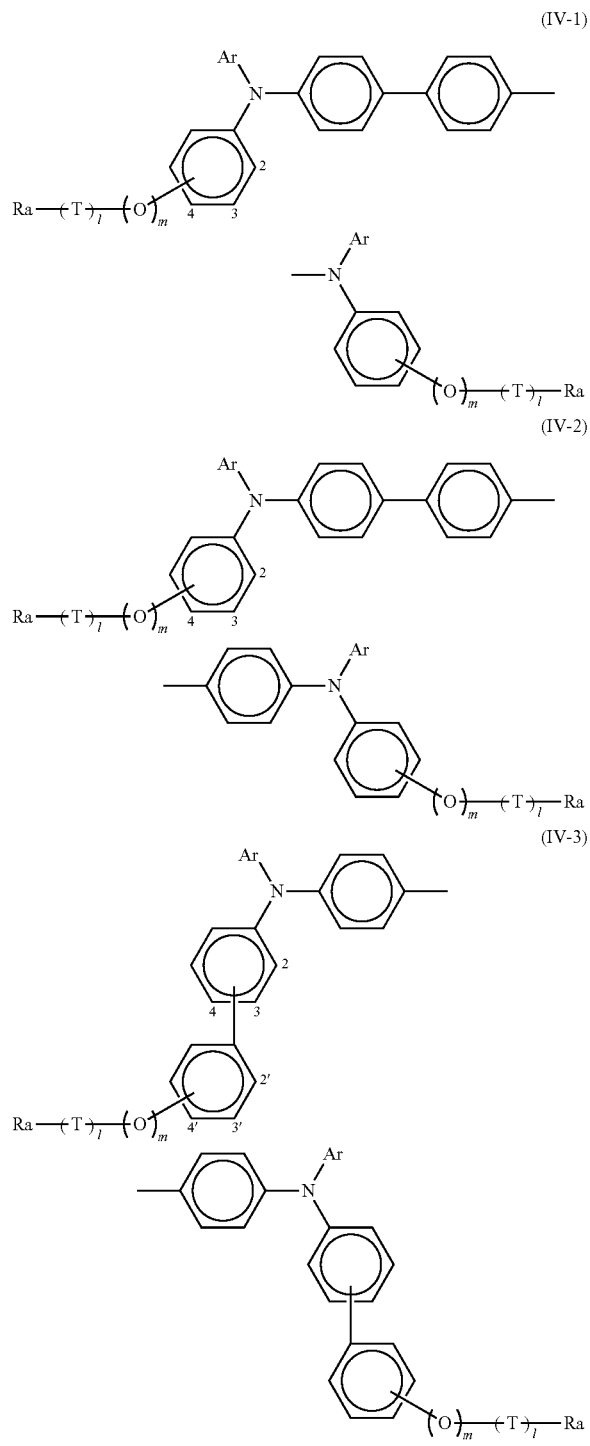

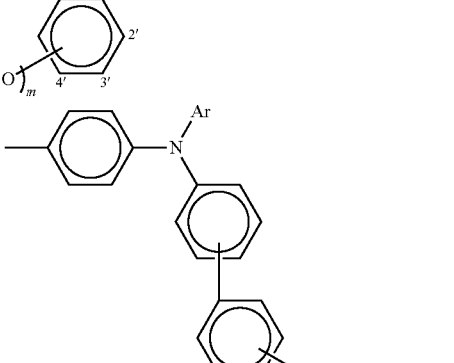

in Formulae (IV-1) to (IV-4), Ar represents a substituted or unsubstituted monovalent polynuclear aromatic hydrocarbon having 2 to 10 aromatic rings, a substituted or unsubstituted monovalent aromatic heterocyclic ring, or a substituted or unsubstituted monovalent aromatic group containing at least one aromatic heterocyclic ring, Ra represents at least one substituted silicon group represented by the Formula (III); m and l are 0 or 1; and T represents a divalent straight-chain hydrocarbon having 1 to 6 carbon atoms or a branched hydrocarbon having 2 to 10 carbon atoms.

15. The organic electroluminescent device of claim 1, wherein the organic compound layer provided in contact with the buffer layer contains the charge-transporting polyester represented by Formulae (I-1) or (I-2).

16. The display device of claim 14, wherein wherein the organic compound layer provided in contact with the buffer layer contains the charge-transporting polyester represented by Formulae (I-1) or (I-2).

17. An organic electroluminescent device comprising an anode and a cathode, at least one of which is transparent or translucent, and an organic compound layer disposed between the anode and the cathode, the organic compound layer having two or more layers including at least a buffer layer and an emitting layer;

at least one of the organic compound layers other than the buffer layer containing at least one charge-transporting polyester represented by the following Formula (I-1);

the buffer layer being provided in contact with the anode and containing a crosslinked compound formed by using at least one charge injection material containing a substituted silicon group represented by the following Formula (III); and the charge injection material being at least one aromatic amine compound represented by the following Formula (IV-1):

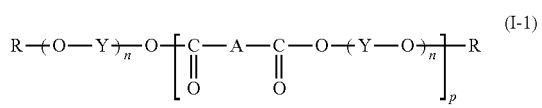
(I-1)

in Formula (I-1), A representing at least one structure selected from the structures represented by the following Formula (II-1); R is $OCH_3$; Y is $(CH_2)_2$; n is an integer of 1; and p being an integer of 5 to 5,000,

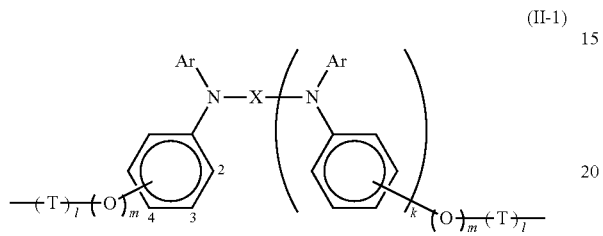
(II-1)

in Formula (II-1), Ar is a monovalent aromatic group represented as $C_6H_4C_6H_5$; X is a

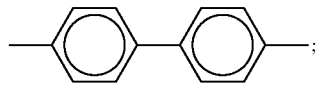

divalent aromatic group represented by the following structure k is 1; l is 1; m is 0; T is $(CH_2)_2$,

(III)

in Formula (III), Q is $OCH_3$; and a is an integer of 3, and

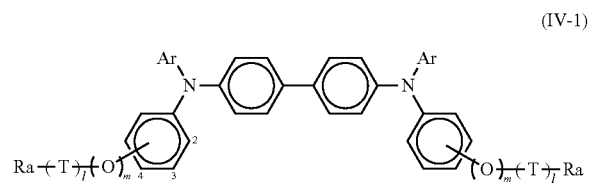
(IV-1)

in Formula (IV-1), Ar is a monovalent aromatic group represented as $C_6H_4C_6H_3(CH_3)(OCH_3)$; Ra represents a substituted silicon group represented by the Formula (III) which is $Si(OCH_3)_3$; m is 0; l is 1; and T is $(CH_2)_3$.

* * * * *